(12) United States Patent
Fujita

(10) Patent No.: US 6,828,817 B2
(45) Date of Patent: Dec. 7, 2004

(54) TESTING DEVICE INCLUDED IN THE ELECTROOPTIC DEVICE

(75) Inventor: Shin Fujita, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/347,581

(22) Filed: Jan. 22, 2003

(65) Prior Publication Data

US 2003/0180975 A1 Sep. 25, 2003

(30) Foreign Application Priority Data

Feb. 12, 2002 (JP) ........................................ 2002-034708

(51) Int. Cl.⁷ .............................................. G01R 31/00
(52) U.S. Cl. .................... 324/770; 359/245; 377/19; 377/20; 377/28; 377/29; 385/2; 385/8
(58) Field of Search ............................ 324/770; 385/2, 385/8; 359/245, 299, 315, 484; 377/19, 20, 28, 29, 102; 349/87, 88, 97, 73.1, 158.1, 537, 765, 770

(56) References Cited

U.S. PATENT DOCUMENTS 5,363,037 A * 11/1994 Henley et al. ........... 324/158.1

2003/0107698 A1 * 6/2003 Nagayama et al. ......... 349/149

FOREIGN PATENT DOCUMENTS

JP 2001-013519 1/2001

* cited by examiner

Primary Examiner—John F. Niebling
Assistant Examiner—Stanetta Isaac
(74) Attorney, Agent, or Firm—Oliff & Berridge, PLC

(57) ABSTRACT

The invention provides an electrooptic device and an electronic apparatus, in which the electrical characteristics of many thin-film switching elements formed in a substrate to support an electrooptic material can be accurately inspected. The invention also provides a method for making the electrooptic device. In a TFT array substrate of a liquid crystal device, an inspection TFT is formed in one of dummy pixels disposed at the periphery of a pixel region. A pixel electrode connected to a drain region of the TFT functions as a first inspection pad. In an adjacent dummy pixel, the pixel electrode electrically connected to an extended portion of a data line functions as a second inspection pad. In another adjacent dummy pixel, the pixel electrode electrically connected to an extended portion of a scan line via a junction electrode functions as a third inspection pad.

8 Claims, 21 Drawing Sheets

(A)

(B)

(A)

(B)

Related Art

Related Art

TESTING DEVICE INCLUDED IN THE ELECTROOPTIC DEVICE

BACKGROUND OF THE INVENTION

1. Field of Invention

The present invention relates to an electrooptic device and an electronic apparatus having many electrical elements formed on a substrate that supports an electrooptic material. The invention also relates to a method for making such an electrooptic device. Specifically, the invention relates to examining electrical characteristics of the electrical devices formed on the substrate.

2. Description of Related Art

In related art electrooptic devices, such as liquid crystal devices and organic electroluminescent devices, many switching elements are formed on a substrate supporting an electrooptic material.

An example of such an electrooptic device is an active matrix liquid crystal device employing thin film transistors, hereinafter "TFTs," as the pixel switching elements. In making the device, as shown in FIG. 20, components of a plurality of TFT array substrates 10 are formed on a large substrate 10e, and the large substrate 10e is cut along cutting lines 10f so as to prepare individual TFT array substrates 10 used in liquid crystal devices.

The regions sandwiched by the cutting lines 10f are generally used in the related art as inspection regions 10g to inspect pixel-switching TFTs 30 formed in a matrix inside pixel regions 10a of the TFT array substrates 10 and to inspect driving-circuit TFTs (not shown) that constitute driving circuits 101 and 104, as shown in FIG. 21.

In other words, the pixel-switching TFT 30 is formed in each of the pixels arranged in a matrix on each TFT array substrate 10. When the TFT array substrate 10 is of an internal driving circuit type, the driving circuits 101 and 104 are constituted from TFTs (not shown). In the related art, the process for forming these TFTs is also used to form an inspection TFT 30g' functioning as an inspection pattern, a first inspection pad 31g' electrically connected with a drain region of the inspection TFT 30g', a second inspection pad 32g' electrically connected with a source region of the inspection TFT 30g', and a third inspection pad 33g' electrically connected with a gate electrode of the inspection TFT 30g' within the inspection region 10g. These processes are performed onto the large substrate 10e shown in FIG. 20, and one inspection TFT 30g' is formed in the inspection region 10g near one TFT array substrate 10 (one-to-one correspondence).

The electrical characteristics of the inspection TFTs 30g' are examined by bringing inspection terminals into contact with the inspection pads 31 g', 32g', and 33g' while they are mounted on the large substrate 10e. If the electrical characteristics of the inspection TFT 30g' are satisfactory, those of the pixel-switching TFTs 30 formed in the corresponding TFT array substrate 10 are assumed to be satisfactory, and the TFT array substrate 10 is assembled into a liquid crystal device. On the other hand, if the inspection TFT 30g' is found to be defective, the pixel-switching TFTs 30 formed in the corresponding TFT array substrate 10 are assumed to be defective, and this TFT array substrate 10 is discarded. As a result, the yield can practically be increased. Moreover, the position in the large substrate 10e that is likely to suffer from defects can be detected, and the results can be easily reflected in the manufacturing process.

SUMMARY OF THE INVENTION

However, in the related art, the region where the inspection TFT 30g' is formed is distant from the region where the pixel-switching TFTs 30 and driving-circuit TFTs are formed. This is because the inspection TFT 30g' is formed outside the region of the TFT array substrate 10, although the inspection TFT 30g' is formed near the region where the TFT array substrate 10 is formed in the large substrate 10e.

Accordingly, when the TFTs are formed using the semiconductor process, the results at the inspection TFT 30g' may not correspond with the quality of the pixel-switching TFTs 30 and the driving-circuit TFTs due to variation in the characteristics of the TFTs resulting from the position in the substrate. Moreover, the pattern density in the region where the pixel switching TFT 30g and the driving-circuit TFTs are formed is significantly different from the pattern density in the region where the inspection TFT 30g' is formed. Thus, when the TFTs are made using the semiconductor process, for example, the influence of the pattern density on exposure is significantly different between the region where the pixel-switching TFTs 30 and the driving-circuit TFTs are formed and the region where the inspection TFT 30g' is formed. Because of this, in some cases, the inspection results at the inspection TFT 30g' do not reflect the quality of the pixel switching TFTs 30 and the driving-circuit TFTs.

To address or overcome these problems, the present invention provides an electrooptic device and an electronic apparatus, in which electrical characteristics of many thin-film switching elements formed on a substrate to support an electrooptic material can be reliably inspected. The invention also provides a method for making the electrooptic device.

To address or overcome the above-described problems, the present invention provides an electrooptic device including a substrate to support an electrooptic material and an electrical-element-forming region formed on the substrate and including many thin-film switching elements, in which an inspection pattern to examine characteristics of the thin-film switching elements and inspection pads electrically connected to the inspection pattern are formed inside the electrical-element-forming region.

Moreover, the preset invention also provides a method for making an electrooptic device including a substrate to support an electrooptic material and an electrical-element forming region formed on the substrate and including many thin-film switching elements. The method includes forming an inspection pattern to inspect the electrical characteristics of the thin-film switching elements inside the electrical-element forming region simultaneously with forming the thin-film switching elements inside the electrical-element-forming region of the substrate, and forming inspection pads electrically connected to the inspection pattern; examining the electrical characteristics of the inspection pattern by placing inspection terminals into contact with the inspection pads; and manufacturing the electrooptic device using the substrates that have been determined to have satisfactory quality as a result of inspection.

In this invention, the inspection pattern to examine the thin-film switching element formed inside the electrical-element-forming region is formed inside the electrical-element-forming region, so that the thin film switching element to be examined and the inspection pattern used in actual measuring are disposed nearby. Thus, when thin-film switching elements, such as TFTs, are formed in a substrate by a semiconductor process, the electric characteristics of the thin-film switching element to be examined accurately corresponds with the electrical characteristics of the inspection pattern used in actual measuring, even when the characteristics of the TFT vary depending on the positions in the substrate. Moreover, the conditions, such as pattern density, are the same between the region where the thin-film switching elements, i.e., the objects of the inspection, are formed and the region where the inspection pattern is formed. This is because the inspection pattern used in actual inspection is formed in the electrical-element-forming region. Thus, for example, the effect of exposure on the pattern density is the same between the region where the thin-film switching element to be examined are formed and the region where the inspection pattern is formed. Thus, the correspondence between the electrical characteristics of the thin-film switching elements to be examined and the electrical characteristics of the inspection pattern used in actual measuring is highly accurate. Accordingly the electrical characteristics of the thin film switching element formed in the substrate to support the electrooptical material can be accurately inspected.

In this invention, the electrical-element-forming region is, for example, a pixel region in which pixels having pixel electrodes to drive the electrooptic material and pixel-switching active elements formed as the thin-film switching elements to drive the pixel electrodes are arranged in a matrix. In such a case, the pixel region generally has an effective pixel region and a dummy pixel region arranged at the external periphery of the effective pixel region are formed in the pixel region, the effective pixel region including a plurality of effective pixels, arranged in a matrix to display images, the dummy pixel region including a plurality of dummy electrodes covered with a light-shielding member so as not to directly contribute to display of images. In the present invention, the inspection pattern and the inspection pads are preferably formed inside the dummy pixel region.

In other words, in the method for making the electrooptic device, when pixel region in which pixels having pixel electrodes to drive the electrooptic material and pixel-switching active elements formed as the thin-film switching elements to drive the pixel electrodes are arranged in a matrix is formed as the electrical-element-forming region, the inspection pattern and the inspection pads are preferably formed at the peripheral region inside the pixel region. In such a case, when the electrooptical device is assembled using the substrate, the center region of the pixel region is an effective pixel region in which effective pixels to display images are arranged in a matrix, and the peripheral region inside the pixel region is a dummy pixel region covered with a light-shielding member, the dummy pixel region including dummy pixels that do not directly contribute to the display of images.

According to this structure, the pixel-switching TFTs as the thin-film switching element to be inspected are near the inspection pattern used in actual measuring are disposed nearby and at a position having the same pattern density. Thus, the electrical characteristics of the pixel-switching TFTs to be inspected and the electrical characteristics of the inspection pattern used in actual measuring show high correspondence. Thus, the electrical characteristics of the pixel-switching TFTs formed in the pixel region of the substrate to support the electrooptic material can be accurately inspected. Moreover, because the inspection pattern and the inspection pads are disposed in the dummy pixel region in the pixel region, the number of the effective pixels to display images does not decrease.

In the present invention, a pixel-switching TFT, functioning as an active element for pixel switching, may be provided to each of the effective pixels and dummy pixels. The pixel-switching TFT may include a source region electrically connected to a data line, a drain region electrically connected to the pixel electrode, and a channel region opposing a gate electrode with an insulating film therebetween. Preferably, in such a case, the inspection pattern is formed in at least one of the plurality of dummy pixels, the inspection pattern including an inspection thin-film transistor having the same size and the same structure as the pixel-switching thin-film transistor. Preferably, in the dummy pixel region, a first inspection pixel in which the inspection thin-film transistor is formed is provided with a first inspection pad electrically connected to the drain region of the inspection thin-film transistor, a second inspection pixel adjacent to the first inspection pixel is provided with a second inspection pad electrically connected to the source region of the inspection thin-film transistor, and a third inspection pixel adjacent to the first inspection pixel is provided with a third inspection pad electrically connected to a gate electrode of the inspection thin-film transistor. With this structure, three inspection pads necessary to inspect the thin-film switching elements can have sufficiently large area.

In the present invention, the first inspection pad is preferably electrically connected, via a contact hole in an interlayer insulating film, to a drain electrode connected to the drain region of the inspection thin-film transistor. The second inspection pad is preferably electrically connected to an extended portion of the data line via a contact hole in the interlayer insulation film, the extended portion extending to the second inspection pixel. The third inspection pad is preferably electrically connected to an extended portion of the gate electrode via a contact hole in the interlayer insulation film, the extended portion extending to the third inspection pixel. With this structure, the step for making the pixel-switching TFTs in the pixel region can be used to form electrical connections between the inspection pads and the inspection TFTs.

In the present invention, when the TFT array substrate is of an internal-driving-circuit type, a pixel region in which pixels including pixel electrodes to drive the electrooptic material and pixel-switching thin-film transistors to drive the pixel electrodes are arranged in a matrix is formed in the substrate, and an electrical-element forming region is formed outside the pixel region, the electrical-element forming region including a driving circuit including many driving-circuit thin-film transistors as the thin-film switching elements to supply signals to the pixel switching thin-film transistors. When the driving circuit TFTs are examined for the TFT array substrate, the inspection pattern and the inspection pads are formed inside a driving-circuit forming region where the driving circuit is formed, and the inspection pattern is formed in a free region where no driving-circuit thin-film transistors are formed, the free region being inside the driving-circuit forming region. With this structure, the driving-circuit TFTs as the thin-film switching elements to be inspected and the inspection pattern used in actual measuring are disposed nearby and at a position having the same pattern density. Accordingly, the electrical characteristics of the driving-circuit TFTs to be inspected and the electrical characteristics of the inspection pattern used in actual measuring show high correspondence. Thus, the electrical characteristics of the driving-circuit TFTs formed in the driving-circuit region in the substrate for supporting the electrooptical material can be accurately determined. Moreover, since the inspection pattern is formed in the free region in the driving-circuit region, extension of the driving circuit is not necessary.

The inspection pattern used to examine the electrical characteristics of the driving-circuit TFTs preferably has the same structure and the same size as the driving-circuit TFTs.

In this invention, an example of the electrooptic material is liquid crystal held between the substrate and a counter substrate opposing the substrate with a predetermined gap therebetween.

The electrooptic devices of the present invention can used as display units of electronic apparatuses, such as mobile computers and cellular phones, for example.

DESCRIPTION OF PREFERRED EMBODIMENTS

Figure 1:
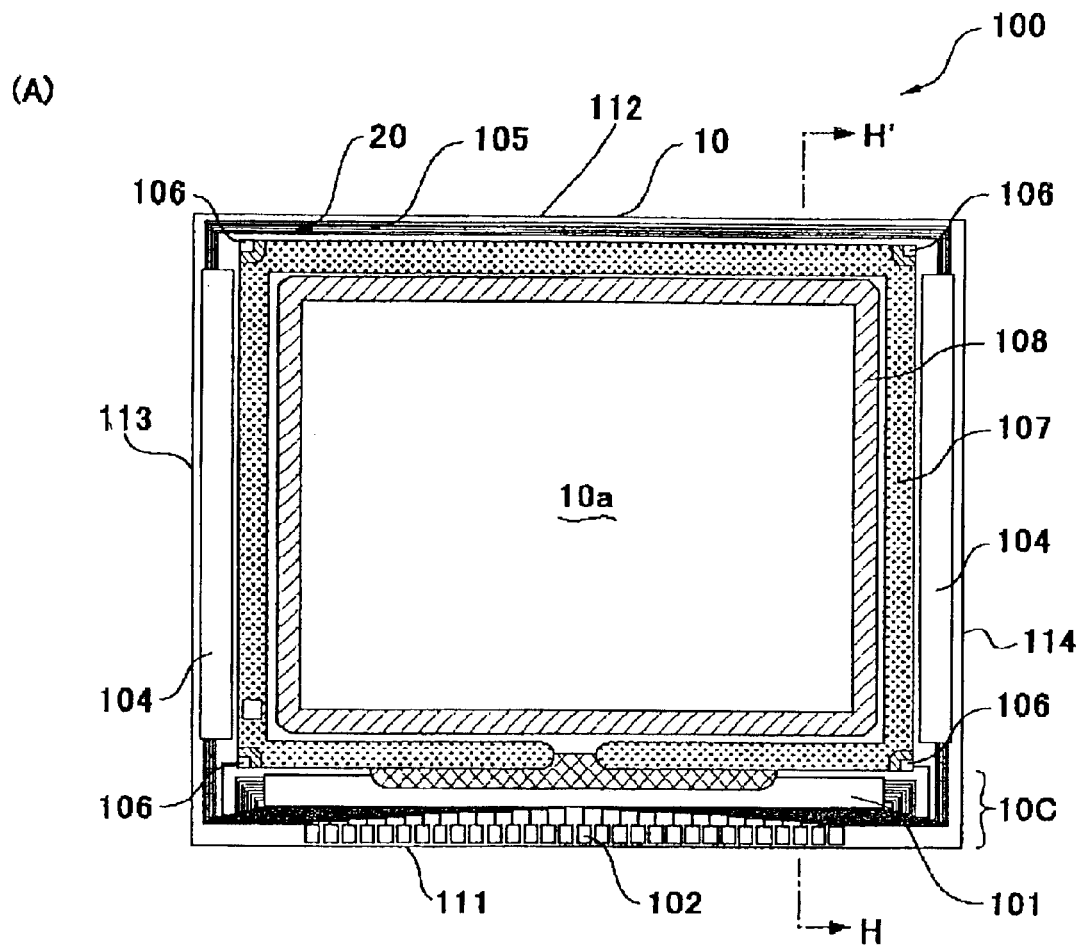
FIGS. 1(A) and 1(B) are, respectively, a plan view of a liquid crystal device with components formed thereon when viewed from the counter-substrate side, and a cross-sectional view including a counter substrate taken along plane H-H' in FIG. 1(A)
Figure 1:
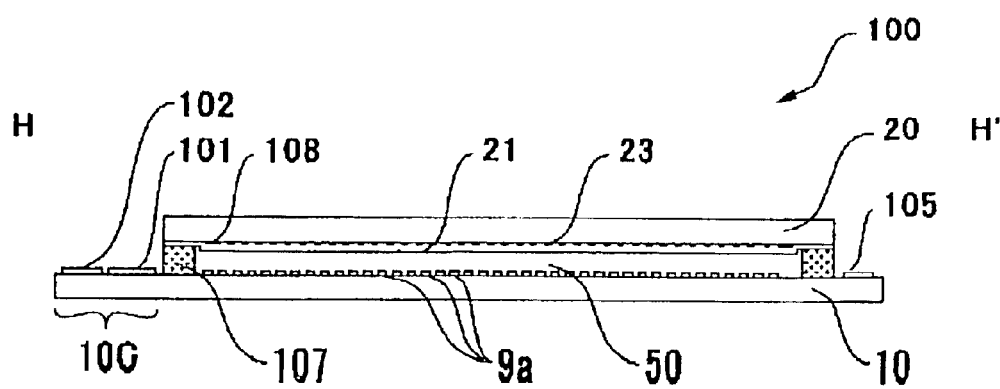

A liquid crystal device, which is a representative example of an electrooptic device, according to an embodiment of the present invention having electrical-element-forming regions, such as a driving-circuit forming region and a pixel region including many TFTs, is described below with reference to the drawings. In the drawings, the layers and the components are depicted in different scales so that they can be identified in the drawings and are not necessarily representative of their actual relative sizes.

(Overall Structure of the Liquid Crystal Device)

FIGS. 1(A) and (B) are, respectively, a plan view of a liquid crystal device with components formed thereon when viewed from the counter-substrate side, and a cross-sectional view including a counter substrate taken along plane H-H' in FIG. 1(A).

In FIG. 1(A), a liquid crystal device 100 (electrooptic device) includes a TFT array substrate 10 and a counter substrate 20 bonded to each other with a sealant 107 provided along the edges of the counter substrate 20. An overhung region 10C overhanging from the counter substrate 20 is formed at the external periphery of the TFT array substrate 10 at a substrate-edge-111 side. A data-line driving circuit 101 and many terminals 102 are formed at the overhung region 10C. Scan line driving circuits 104 are formed at the external periphery of the TFT array substrate 10 along a substrate edge 113 and a substrate edge 114. A plurality of interconnections 105 are formed along a substrate edge 112 opposing the substrate edge 111 in the TFT array substrate 10. The interconnections 105 connect the scan line driving circuits 104 disposed at the two sides of the pixel region 10a. Upper and lower conductive members 106 to provide electrical conduction between the TFT array substrate 10 and the counter substrate 20 are formed at the four corners of the counter substrate 20. The upper and lower conductive members 106 are made by mixing conductive particles, such as silver powder and gold-plated fiber, to an epoxy resin adhesive component.

If delay of scan signals supplied to the scan lines causes no problem, the scan line driving circuit 104 may be disposed at only one side. Alternatively, the data-line driving circuits 101 may be provided along the two sides of the pixel region 10a.

As shown in FIG. 1(B), the TFT array substrate 10 is bonded to the counter substrate 20 by the sealant 107 with a predetermined gap therebetween, and liquid crystal 50 is disposed in the gap. The sealant 107 is an adhesive containing a photocurable resin or a thermosetting resin and bonds the TFT array substrate 10 to the counter substrate 20 at the peripheral portion of the substrates. Gap members, such as glass fibers or glass beads, are blended in the adhesive so as to adjust the distance between the two substrates to a predetermined value.

Pixel electrodes 9a are arranged in a matrix on the TFT array substrate 10, the detailed construction of which is described in later sections. On the other hand, a light shielding film 108 to provide peripheral parting is formed in the inner region of the sealant 107 on the counter substrate 20. The light shielding film 108 is formed of a light-shielding material. Moreover, a light shielding film 23, referred to as a black matrix or a black stripe, is formed on the counter substrate 20 at the regions opposing the vertical and horizontal border regions between the pixel electrodes 9a arranged on the TFT array substrate 10. A counter electrode 21 formed of indium tin oxide (ITO) is formed on the light shielding film 23.

When the liquid crystal device 100 is used in, for example, a projection display device (liquid crystal projector), three liquid crystal devices 100 are used as light valves in red, green, and blue (RGB), respectively. In this case, each color light decomposed by dichroic mirrors for RGB decomposition enters each of the liquid crystal device 100 as projected light. Thus, no color filters are formed in the liquid crystal devices 100. However, when applied to color display units of electronic apparatuses, such as mobile computers, cellular phones, and liquid crystal television sets, as described in later sections, an RGB color filter, together with a protective film, is formed at the region of the counter substrate 20 that opposes the pixel electrodes 9a.

(Structure of the TFT Array Substrate 10)

Figure 2:
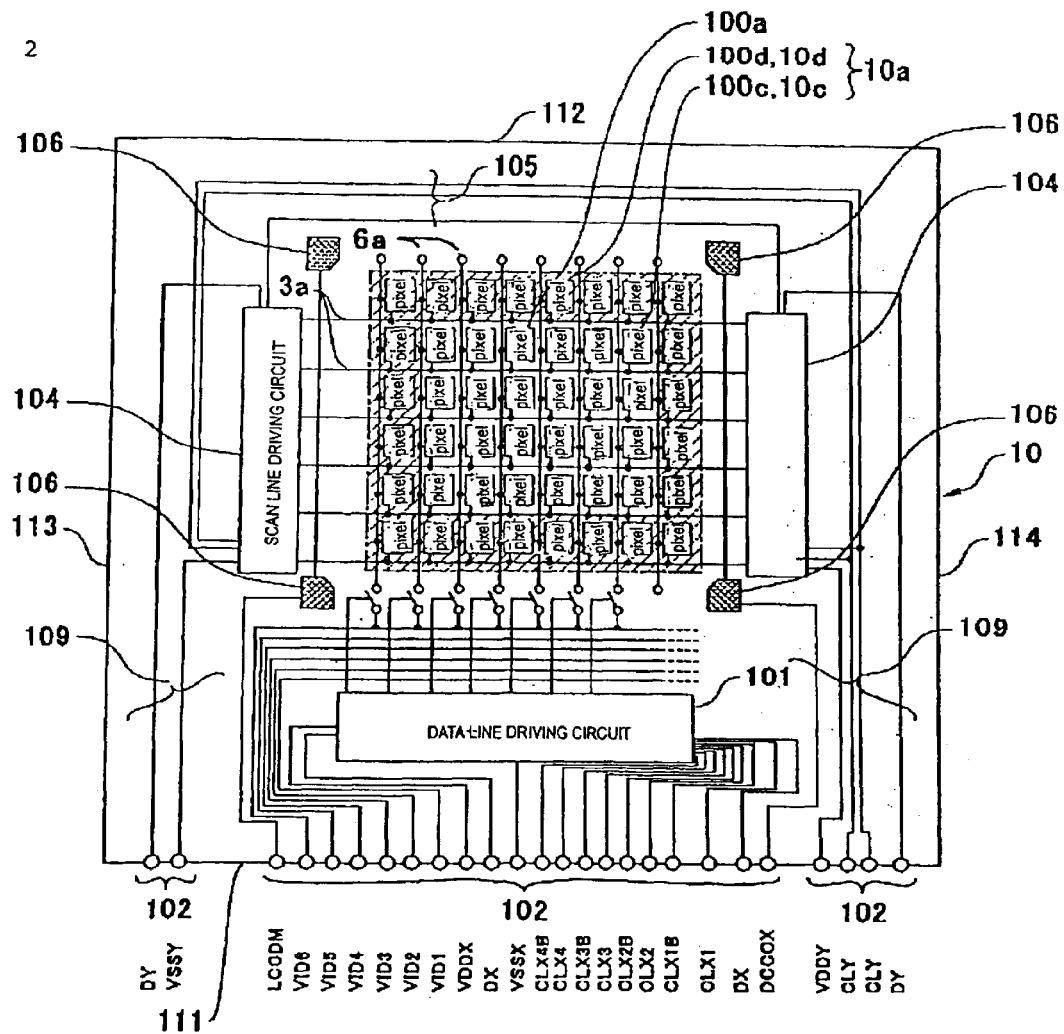
FIG. 2 is a schematic showing the structure of a TFT array substrate used in the liquid crystal device shown in FIGS. 1(A) and 1(B)

FIG. 2 is a schematic showing the structure of the TFT array substrate 10 having internal driving circuits that is used in the liquid crystal device 100.

As shown in FIG. 2, data lines 6a and scan lines 3a are arranged to intersect each other in the pixel region 10a of the TFT array substrate 10 of an internal-driving-circuit type. Pixels 100a are formed in a matrix at the intersections of the data lines 6a and the scan lines 3a. The data-line driving circuit 101 has an X-side shift register circuit, a sample-and-hold circuit including TFTs as analogue switches that operate according to the signals output from the X-side shift register circuit, six picture signal lines corresponding to picture signals VID1 to VID6 expanded in six phases, and the like. The X-side shift register circuit of the data-line driving circuit 101 is, for example, of a four-phase, and a start signal DX, clock signals CLX1 to CLX4, and inverted clock signals CLX1B to CLX4B are supplied from the exterior to the X-side shift register circuit via the terminals 102. The data-line driving circuit 101 is driven according to these signals. Accordingly, the sample-and-hold circuit has each TFT operated according to the signal output from the X-side shift register circuit, and the picture signals VID1 to VID6 are fed to the data lines 6a at a predetermined timing via the picture signal lines so as to supply the picture signals VID1 to VID6 to each pixel. On the other hand, the start signal DY, the clock signal CLY, and the inverted clock signal CLYB are supplied to the scan-line driving circuit 104 from the exterior, and the scan-line driving circuit 104 is operated according to these signals.

The terminals 102, which are conductive films, such as ITO films, metal silicide films, and metal films such as aluminum films, are formed on the TFT array substrate 10 along the substrate edge 111. Constant current sources VDDX, VSSX, VDDY, and VSSY, modulation picture signals (picture signals VID1 TO VID6), various driving signals, etc., are input to the terminals 102. A plurality of signal interconnections 109, which are formed of metal silicide film, a low-resistance metal film such as aluminum film, or the like, to drive the data-line driving circuit 101 and the scan line driving circuits 104 extends from these terminals 102.

(First Electrical-element-forming Region)

Figure 3:
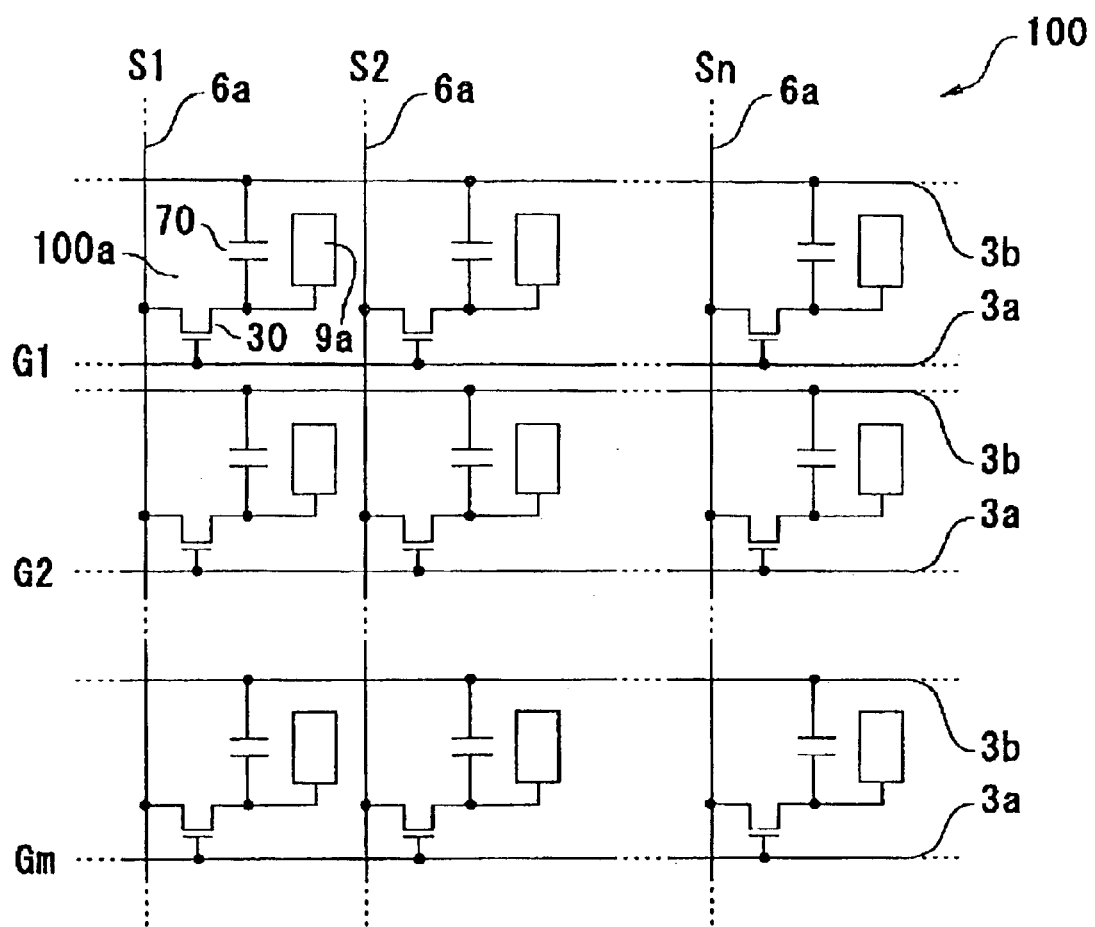
FIG. 3 is an equivalent circuit diagram of various elements of pixels arranged in a matrix inside a pixel region of the liquid crystal device shown in FIG. 2.
Figure 4:
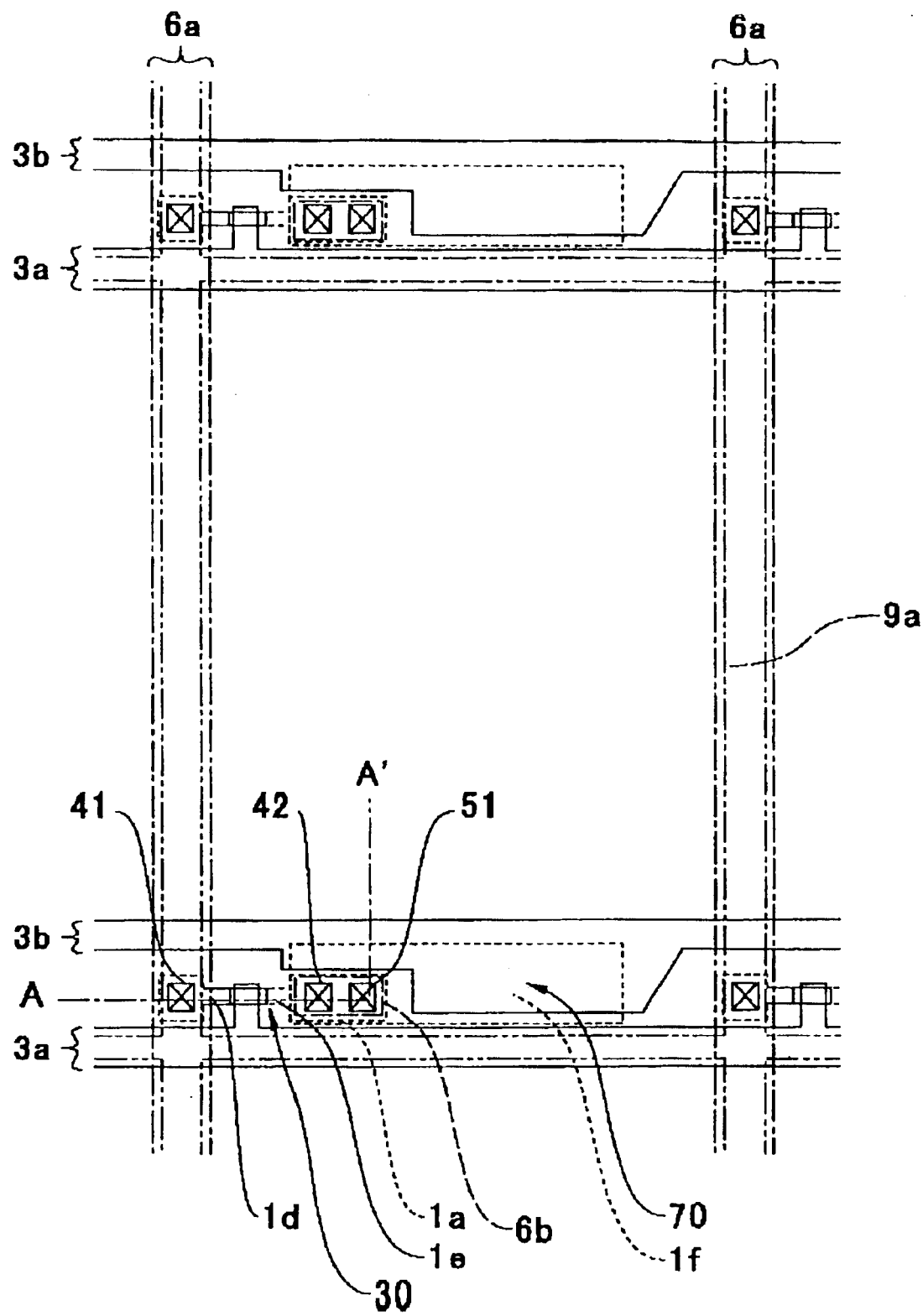
FIG. 4 is a plan view of the pixels shown in FIG. 3.
Figure 5:
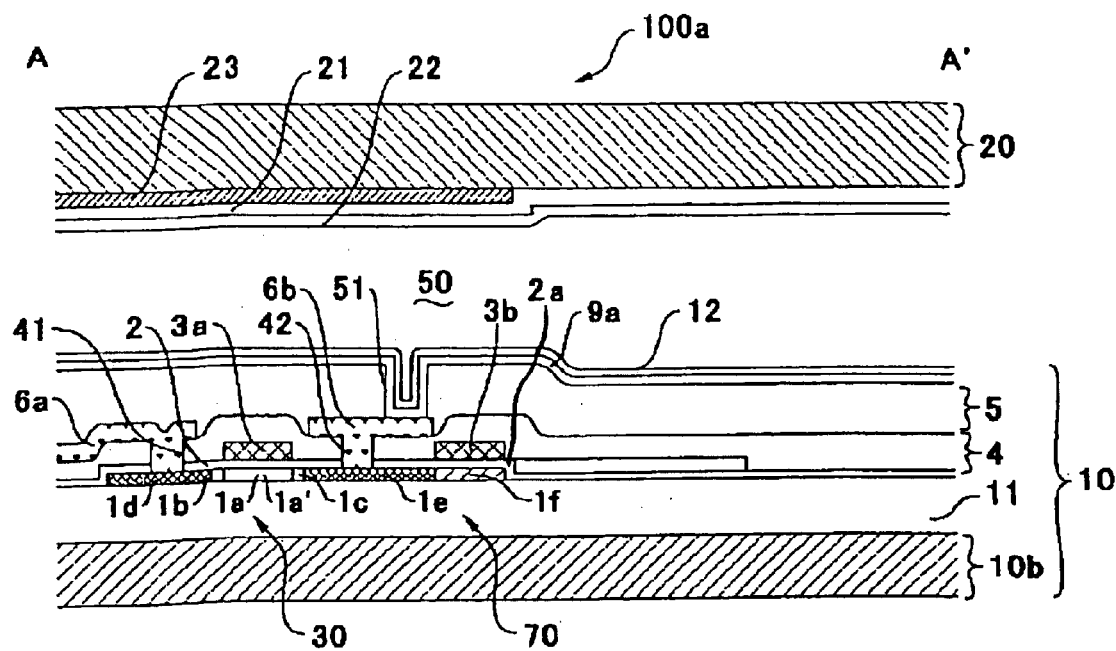
FIG. 5 is a cross-sectional view taken at a position corresponding to plane A-A' in FIG. 4.

FIG. 3 is an equivalent circuit diagram of various elements of the pixels arranged in a matrix in the pixel region 10a of the liquid crystal device 100. FIG. 4 is a plan view of the adjacent pixels 100a on the TFT array substrate. FIG. 5 is a cross-sectional view taken at a position corresponding plane A-A' in FIG. 4, and explains the state of liquid crystal enclosed in the gap between the TFT array substrate and the counter substrate.

As shown in FIG. 3, each of the pixels 100a arranged in a matrix in the pixel region 10a of the liquid crystal device 100 is provided with the pixel electrode 9a and a pixel-switching TFT 30 to control the pixel electrode 9a. The pixel region 10a can be regarded as a first electrical-element-forming region in which many TFTs are formed.

The data lines 6a to supply a pixel signal are electrically connected to the sources of the TFTs 30. Pixel signals S1, S2, . . . , and Sn written in the data lines 6a are supplied in that order in a line sequence. The scan lines 3a are electrically connected to the gates of the TFTs 30. Pulses of scan signals G1, G2, . . . , and Gm are applied to the scan lines 3a in that order in a line sequence at a predetermined timing. The pixel electrodes 9a are electrically connected to the drains of the TFTs 30. The pixel electrodes 9a turn on the TFTs 30, i.e., the switching elements, for a predetermined period of time so as to write the pixel signals S1, S2, . . . , and Sn, which are supplied from the data lines 6a, on corresponding pixels at a predetermined timing. The pixel signals S1, S2, . . . , and Sn of a predetermined level written on the liquid crystal using the pixel electrodes 9a are held in the gap between the counter substrate 20 and the second transparent electrode 21 shown in FIG. 1(B) for a predetermined period of time.

In order to reduce or prevent leak of the pixel signals held therein, storage capacitors 70 may be additionally provided to the TFT array substrate 10. The storage capacitors 70 are connected in parallel to the liquid-crystal capacitance formed between the pixel electrode 9a and the second transparent electrode 21. With the storage capacitors 70, the voltage of the pixel electrodes 9a are maintained for a time period longer than the time the source voltage is applied by three digits, for example. In this manner, the charge retention property can be enhanced, and a liquid crystal device 100 that displays images at a high contrast ratio can be obtained. Note that the storage capacitors 70 may be arranged with respect to capacitor lines 3b, which are the interconnections to generate capacitance, or may be arranged with respect to the scan lines 3a of preceding stage.

Referring again to FIG. 2, many pixels 100a described with reference to FIG. 3 are arranged in a matrix in the pixel region 10a. Among these pixels 100a, the pixels 100a arranged in a matrix in an effective pixel region 10c at the center of the pixel region 10a are effective pixels 100c actually used in displaying images. The pixels 100a disposed at the external periphery of the effective pixel region 10c in the pixel region 10a degrades the quality of the images due to disclination or the like. Thus, in the liquid crystal device 100, the portion of the pixel region 10a at the external periphery of the effective pixel region 10c is formed as a dummy pixel region 10d that is covered by a light-shielding member, such as a frame during assembly of the liquid crystal device 100. The pixels 100a formed in the dummy pixel region 10d are referred to as dummy pixels 100d which do not directly contribute to display.

In the liquid crystal device 100 having such a structure, the dummy pixels 100d, except for some pixels used for inspection, have the same structure as that of the effective pixels 100c. Accordingly, in the following description referring to FIGS. 4 and 5, no distinction is made between the effective pixels 100c and the dummy pixel 100d.

In FIG. 4, the pixel electrodes 9a made of transparent indium tin oxide (ITO) films are arranged in a matrix on the TFT array substrate 10. The pixel-switching TFTs 30 are connected to the pixel electrodes 9a. The data lines 6a, the scan lines 3a, and the capacitor lines 3b are formed along the horizontal and vertical borders between the pixel electrodes 9a. The TFTs 30 are connected to the data lines 6a and the scan lines 3a. In particular, the data lines 6a are electrically connected to a heavily doped source region 1d of the TFT 30 via a contact hole 41, and the projected portion of the scan line 3a functions as the gate electrode of the TFT 30. The storage capacitor 70 is of a structure in which a lower electrode is overlaid by the capacitor line 3b. The lower electrode of the storage capacitor 70 is formed by allowing an extended portion 1f of a semiconductor film 1a for forming the pixel-switching TFT 30 to have conducting properties.

As shown in FIG. 5, a transparent substrate 10b is used as the base of the TFT array substrate 10. An underlayer protecting film 11, made of a silicon oxide film (insulating film) having a thickness of 300 nm to 500 nm, is formed on the surface of the transparent substrate 10b. An island-shaped semiconductor film 1a having a thickness of 30 nm to 100 nm is formed on the surface of the underlayer protecting film 11. A gate insulating film 2, made of a silicon oxide film having a thickness of approximately 50 to 150 nm, is formed on the surface of the semiconductor film 1a. The scan line 3a having a thickness of 300 nm to 800 nm is formed on the surface of the gate insulating film 2. The portion of the semiconductor film 1a opposing the scan line 3a with the gate insulating film 2 therebetween is a channel region 1a'. A source region including a lightly doped source region 1b and the heavily-doped source region 1d is formed at one side of the channel region 1a', and a drain region including a lightly doped drain region 1c and a heavily doped drain region 1e is formed at the other side of the channel region 1a'.

An interlayer insulating film 4 made from a silicon oxide film having a thickness of 300 nm to 800 nm is formed at the surface of the pixel-switching TFT 30, and an interlayer insulating film 5 made from a silicon nitride film having a thickness of 100 nm to 300 nm is formed on the surface of the interlayer insulating film 4. The data line 6a having a thickness of 300 nm to 800 nm is formed on the surface of the interlayer insulating film 4. The data line 6a is electrically connected to the heavily doped source region 1d via the contact hole 41 formed in the interlayer insulating film 4. A drain electrode 6b formed simultaneously with the data line 6a is disposed on the surface of the interlayer insulating film 4. The drain electrode 6b is electrically connected to the heavily doped drain region 1e via a contact hole 42 formed in the interlayer insulating film 4. The pixel electrode 9a is formed on the surface of the interlayer insulating film 5 and is electrically connected to the drain electrode 6b via a contact hole 51 formed in the interlayer insulating film 4.

An alignment film 12 made from a polyimide film is formed on the upper surface of the pixel electrode 9a. The alignment film 12 is a polyimide film subjected to rubbing treatment.

The capacitor line 3b functioning as an upper electrode is arranged to oppose the extended portion 1f (lower electrode) from the heavily doped drain region 1e so as to form the storage capacitor 70. An insulating film (dielectric film) formed simultaneously with a gate insulating film 2 is disposed between the extended portion 1f and the capacitor line 3b.

The above-described TFT 30 has an LDD structure. Alternatively, the TFT 30 may have an offset structure in which no impurity ion bombardment is performed on the region corresponding to the lightly doped drain region 1b and 1c. Alternatively, the TFT 30 may be a self-alignment-type TFT in which impurity ions are bombarded at a high concentration using the gate electrode (part of the scan line 3a) as a mask so as to form heavily doped source and drain regions by self-alignment.

In this embodiment, the gate electrode (the scan line 3a) of the TFT 30 has a single-gate structure in which only one gate electrode is disposed between the source and drain regions. Alternatively, two or more gate electrodes may be disposed between the source and drain regions. In such a case, an arrangement should be made to apply the same signal to each of the gate electrodes. When the TFT 30 is of a dual gate (double gate) structure, a triple gate structure, or the like, leak current at the junction between the channel and the source-drain regions can be reduced or prevented, and the current during OFF-state can be decreased. The OFF-state current can be further reduced and a stable switching element can be obtained by allowing at least one of the gate electrodes to have the LDD structure of the off-set structure.

(Structure of the Counter Substrate 20)

The light shielding film 23 referred to as a black matrix, a black stripe, or the like is formed in the region of the counter substrate 20 opposing the horizontal and vertical border regions between the pixel electrodes 9a formed in the TFT array substrate 10. The transparent electrode 21, made from an ITO film, is formed on the surface of the light shielding film 23. The alignment film 22, made from a polyimide film, is formed on the surface of the transparent electrode 21. The alignment film 22 is a polyimide film subjected to rubbing treatment.

(Second Electrical-element-forming Region)

Referring again to FIG. 1(A), in the liquid crystal device 100 of this embodiment, peripheral circuits, such as the data-line driving circuit 101 and the scan line driving circuits 104, are formed at the portion of the TFT array substrate 10 around the pixel region 10a.

Figure 6:
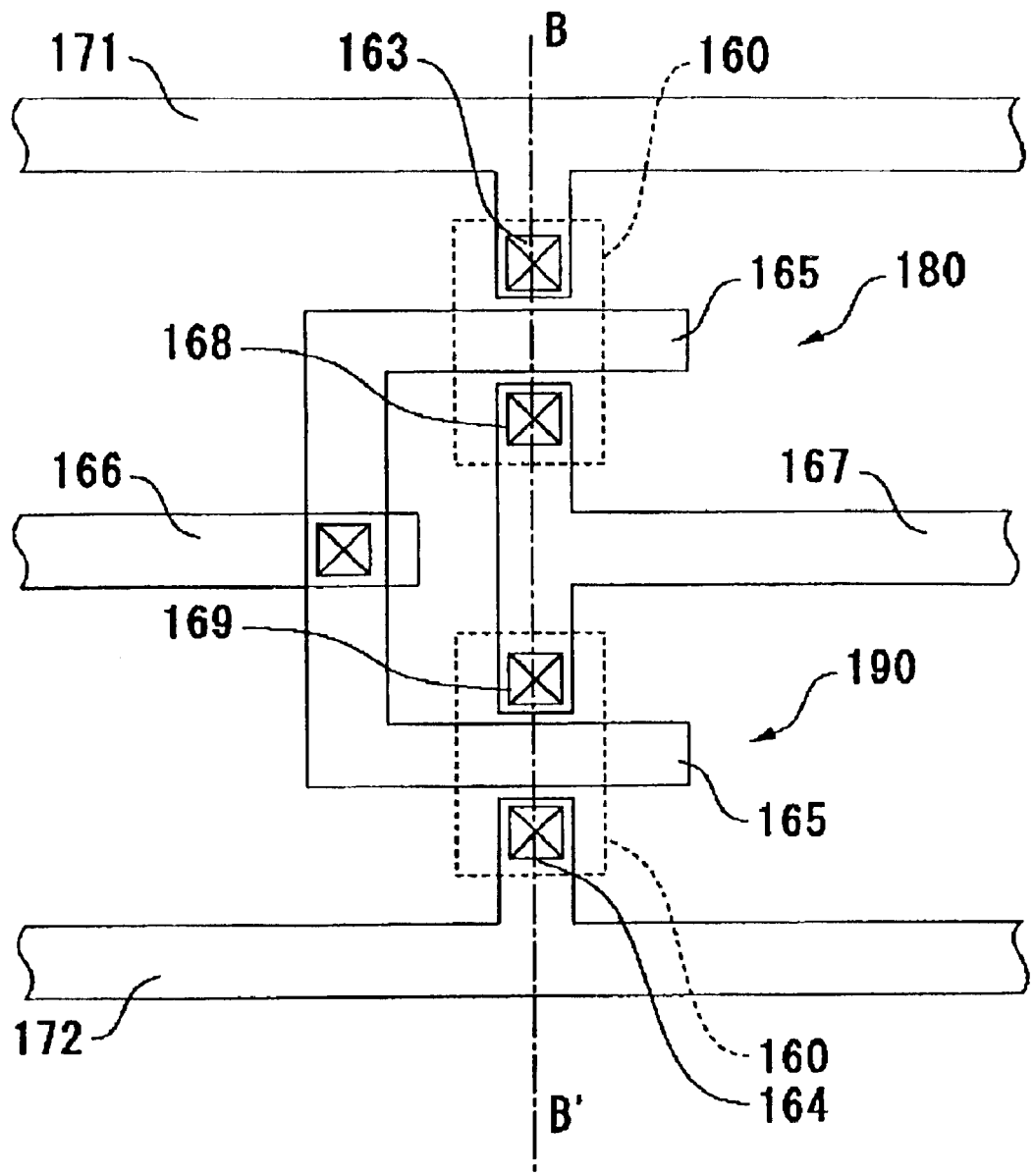
FIG. 6 is a plan view of a driving circuit shown in FIGS. 1(A) and 1(B)
Figure 7:
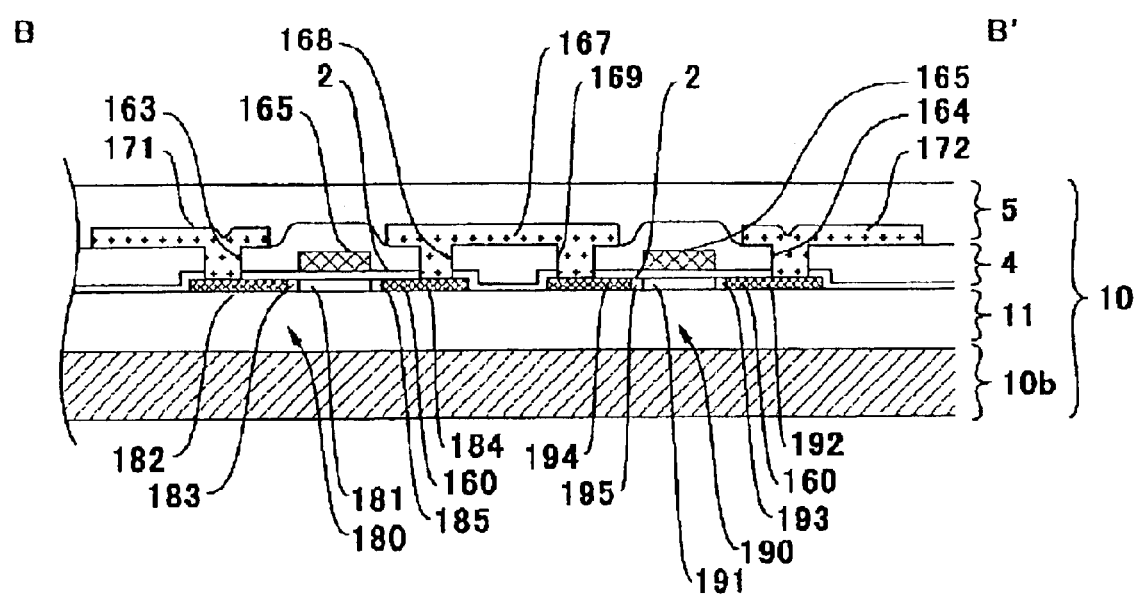
FIG. 7 is a cross-sectional view taken at a position corresponding to plane B-B' in FIG. 6.

The data-line driving circuit 101 and the scan line driving circuits 104 are basically constituted from the N-channel TFTs and the P-channel TFTs shown in FIGS. 6 and 7. The region in which the data-line driving circuit 101 and the scan line driving circuits 104 are formed is regarded as the second electrical-element-forming region.

FIG. 6 is a plan view showing the structure of TFTs that constitute the peripheral circuits, such as scan line driving circuits 104 and the data-line driving circuit 101. FIG. 7 is a cross-sectional view of the TFT constituting the peripheral circuit taken along plane B-B' in FIG. 7.

In FIGS. 6 and 7, the TFT that constitutes the peripheral circuit is a complementary TFT constituted from a P-channel TFT 180 and an N-channel TFT 190. Each island-shaped semiconductor film 160 (outline of which is shown by dotted lines in FIG. 6) of the TFTs 180 and 190 for driving circuits is formed on the surface of the underlayer protecting film 11 of the transparent substrate 10b.

In the P-channel TFT 180, a high-potential line 171 is electrically connected to the source region of the semiconductor film 160 via the contact hole 163. In the N-channel TFT 190, a low-potential line 172 is electrically connected to the source region of the semiconductor film 160 via a contact hole 164. An input interconnection 166 is connected to a common gate electrode 165, and an output interconnection 167 is electrically connected to the drain regions of the semiconductor films 160 via contact holes 168 and 169.

The peripheral circuit region is formed by the same process as the pixel region 10a. Accordingly, the interlayer insulating films 4 and 5 and the gate insulating film 2 are formed in the peripheral circuit region. Moreover, the TFTs 180 and 190 for the driving circuit has the LDD structure as the pixel-switching TFT 30. At the sides of channel forming regions 181 and 191, source regions, which include heavily doped source regions 182 and 192 and lightly doped source regions 183 and 193, and drain regions, which include heavily doped drain regions 184 and 194 and lightly doped drain regions 185 and 195, are formed. A P-channel TFT may be of a structure that is free of lightly doped source and drains regions.

(Structure of the Inspection Pattern and the Inspection Pad)

Many TFTs are formed in the TFT array substrate 10 of the liquid crystal device 100 having the above-described structure. Accordingly, the defects in the TFTs are examined before the TFT array substrate 10 is assembled into the liquid crystal device 100, i.e., while still in the form of the array substrate 10. In this embodiment, as described below with reference to FIGS. 8 to 11, inspection TFTs as an inspection pattern and inspection pads that come into contact with the inspection terminals during inspection are formed in the pixel region 10a (first electrical-element-forming region) and the driving-circuit-forming region (second electrical-element-forming region), as shown in detail in FIG. 2.

Figure 8:
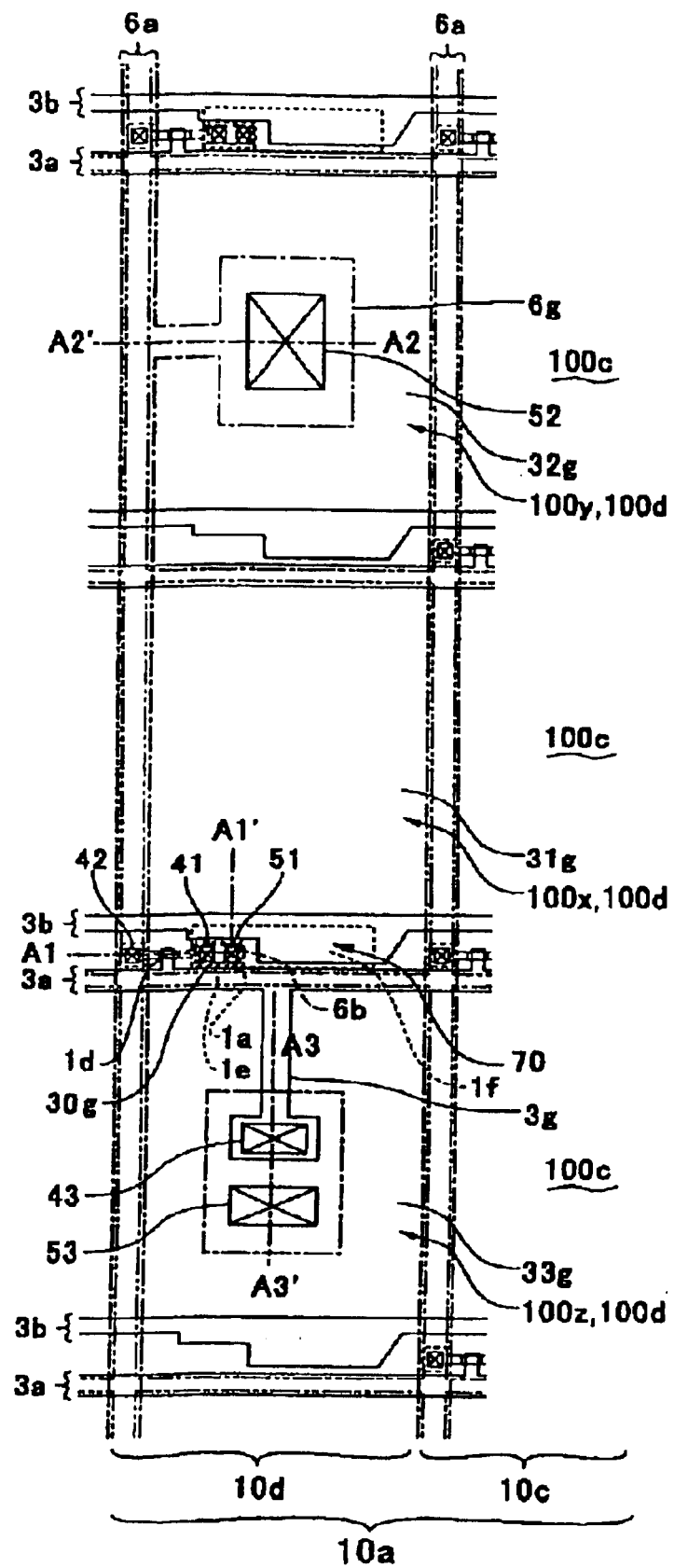
FIG. 8 is a plan view showing the structures of the inspection TFTs and inspection pads to examine the pixel switching TFTs formed in the pixel region shown in FIG. 2.
Figure 9:
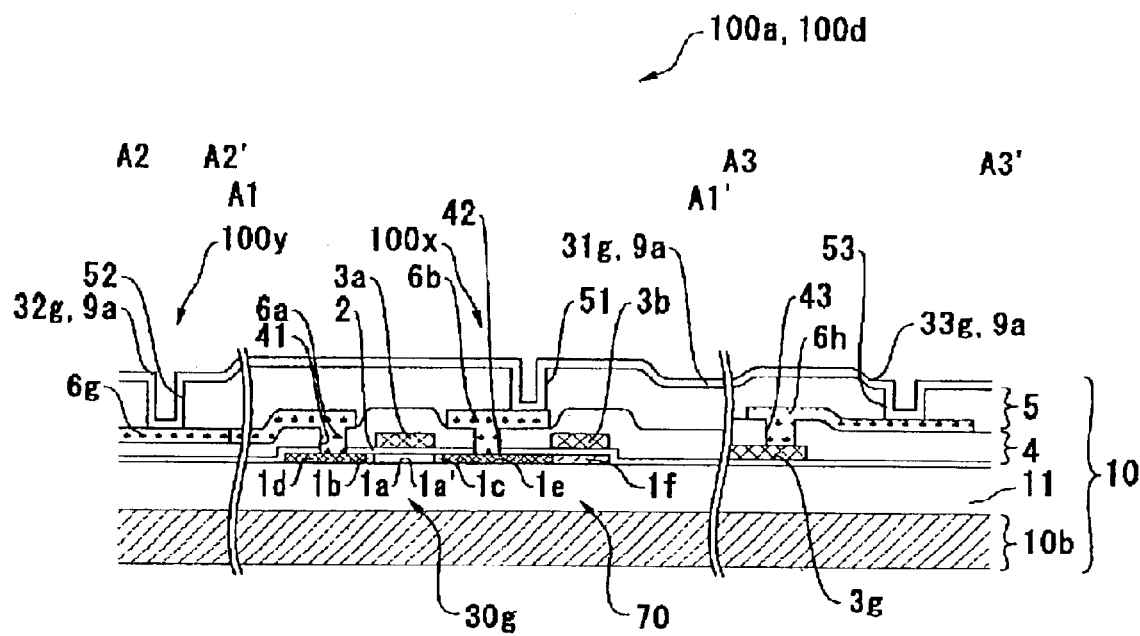
FIG. 9 is a cross-sectional view taken at positions corresponding to planes A1-A1', A2-A2', and A3-A3' in FIG. 8.
Figure 10:
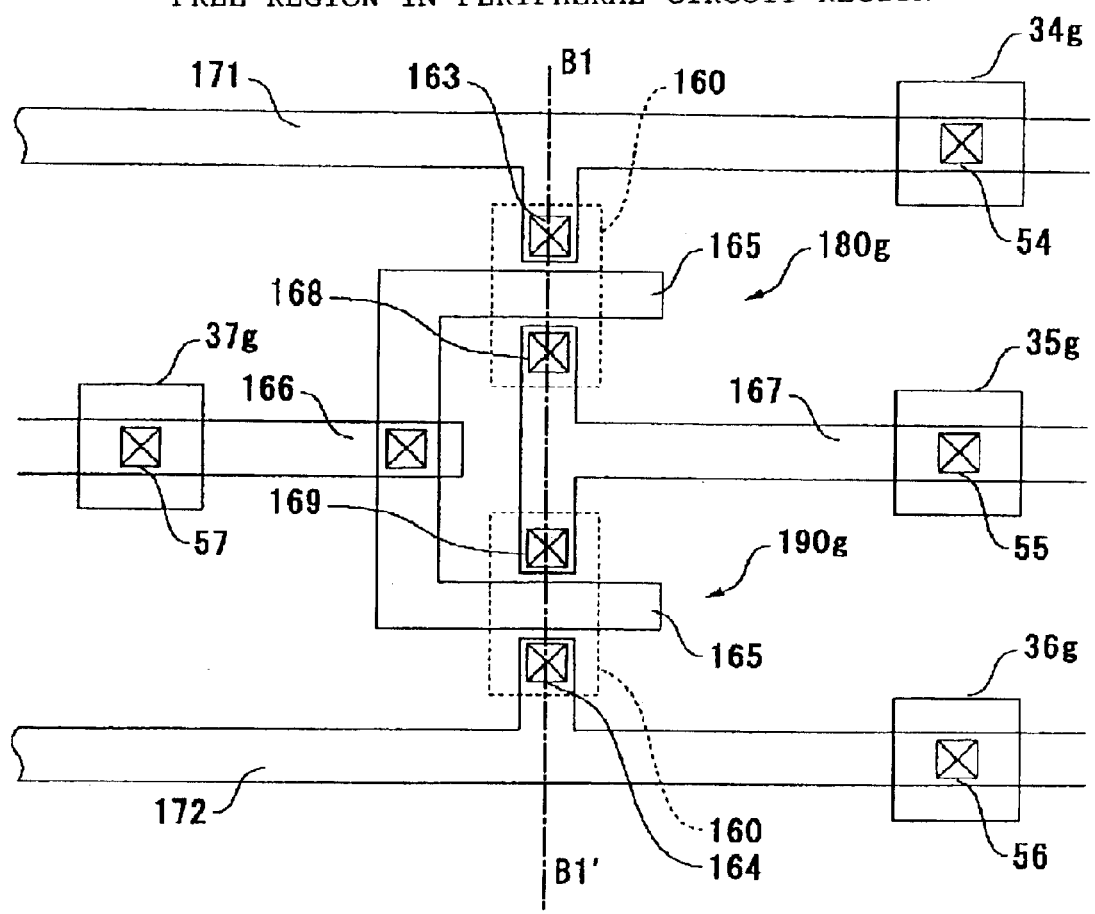
FIG. 10 is a plan view showing the structures of the inspection TFT and the inspection pads to examine the driving-circuit TFTs used in the driving circuit shown in FIGS. 6 and 7.
Figure 11:
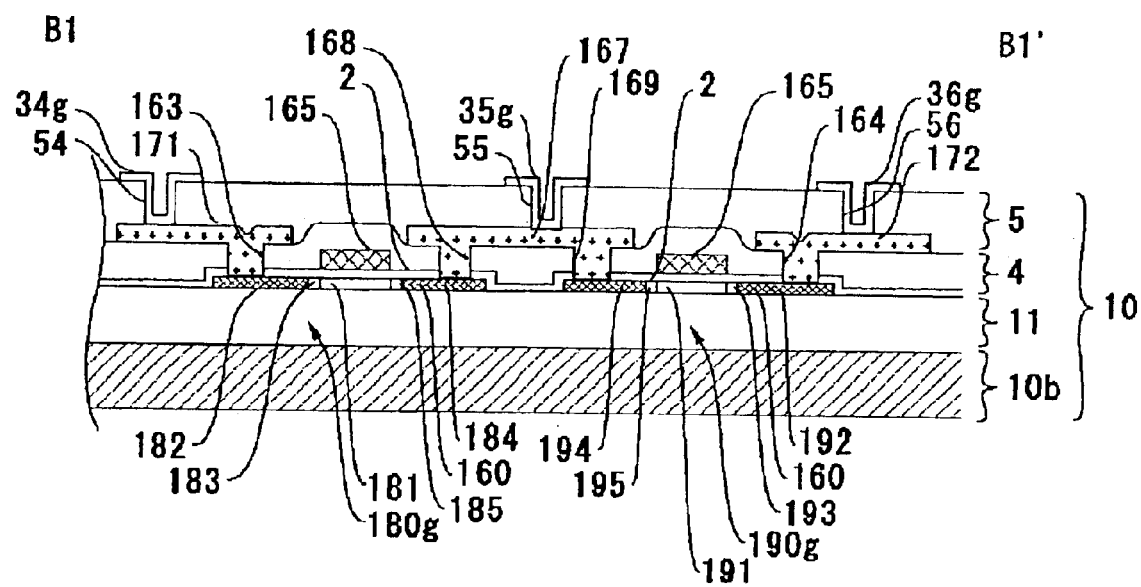
FIG. 11 is a cross-sectional view taken at a position corresponding to plane B1-B1' in FIG. 10.
Figure 12:
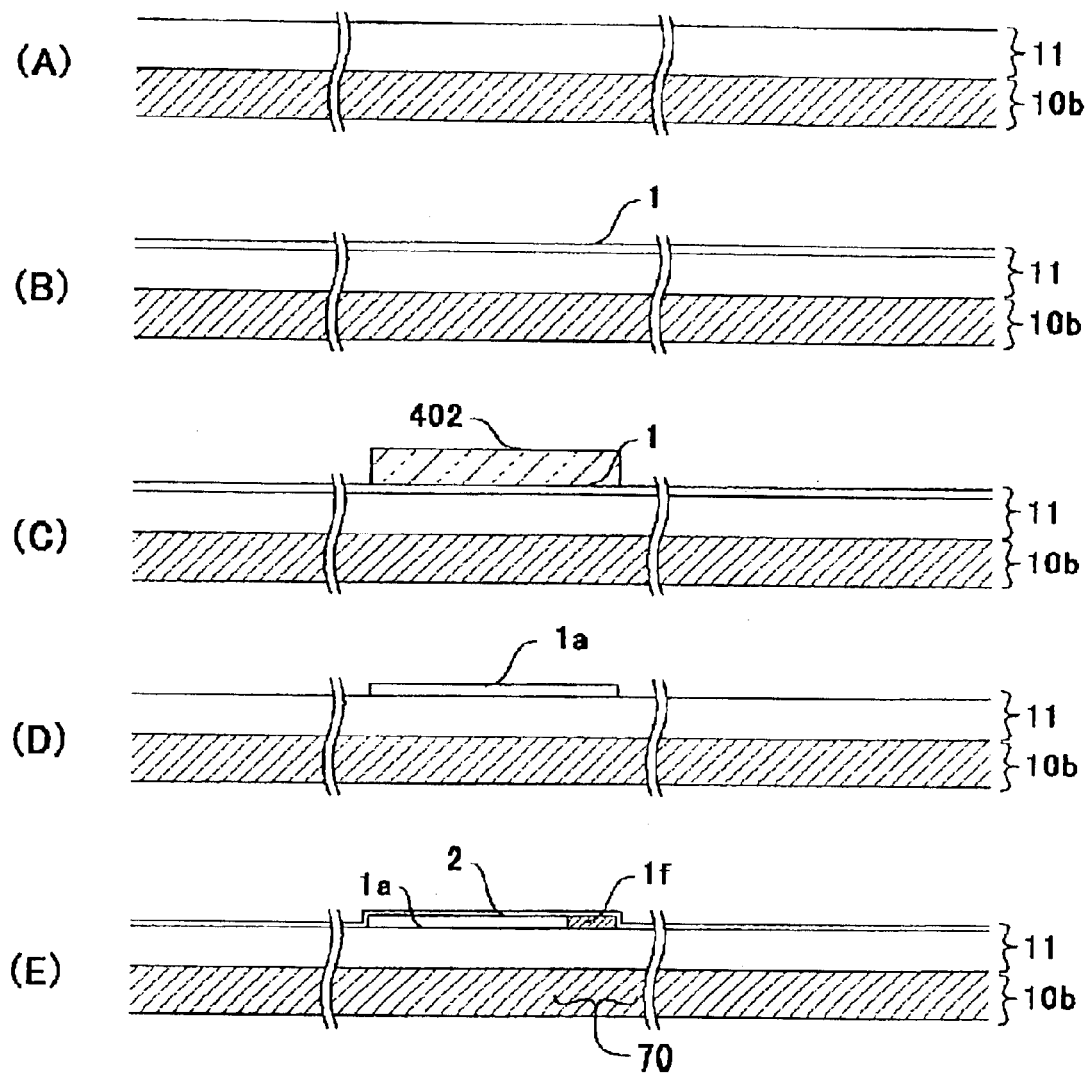
FIGS. 12(A) to 12(E) are cross-sectional views showing a method for making the TFT array substrate of the present invention.
Figure 13:
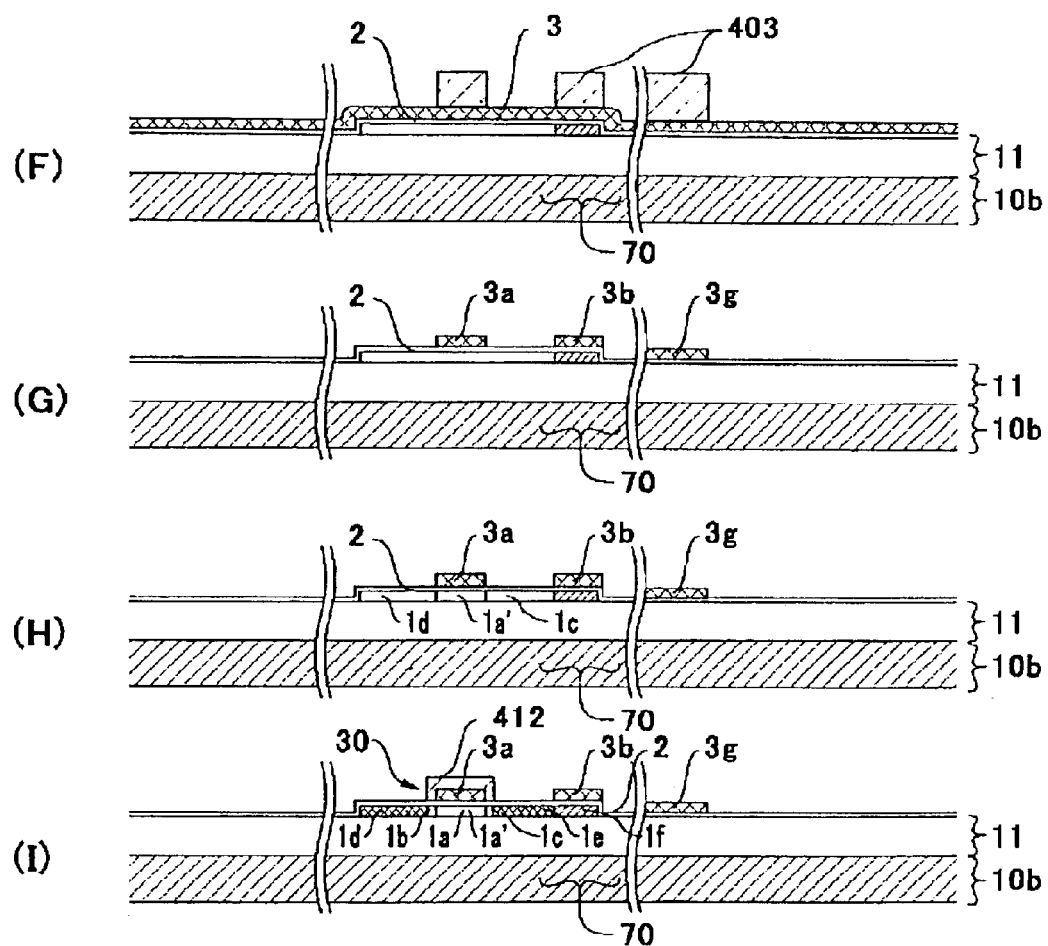
FIGS. 13(F) to 13(I) are cross-sectional views showing a method for making the TFT array substrate of the present invention.
Figure 14:
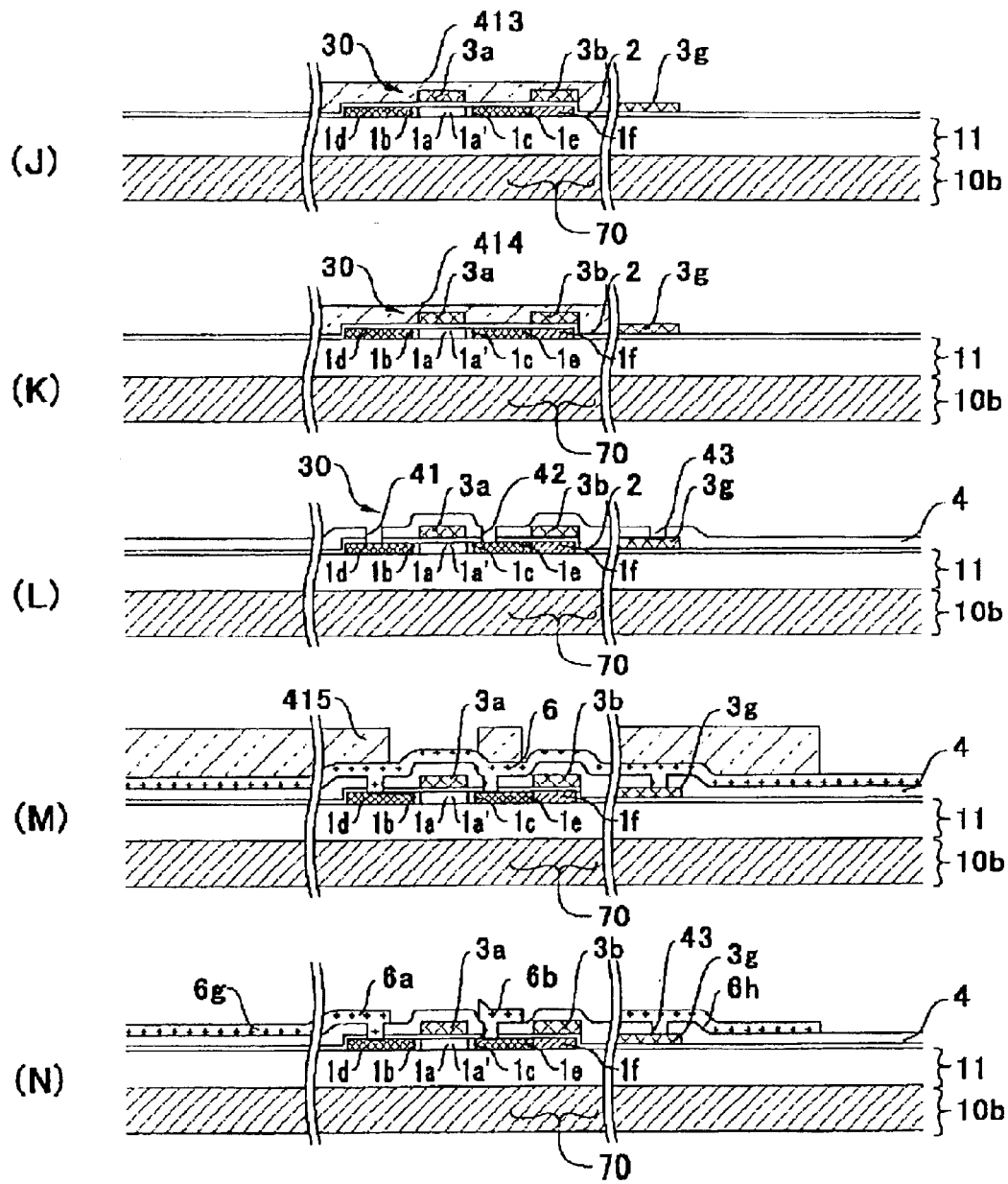
FIGS. 14(J) to 14(N) are cross-sectional views showing a method for making the TFT array substrate of the present invention.
Figure 15:
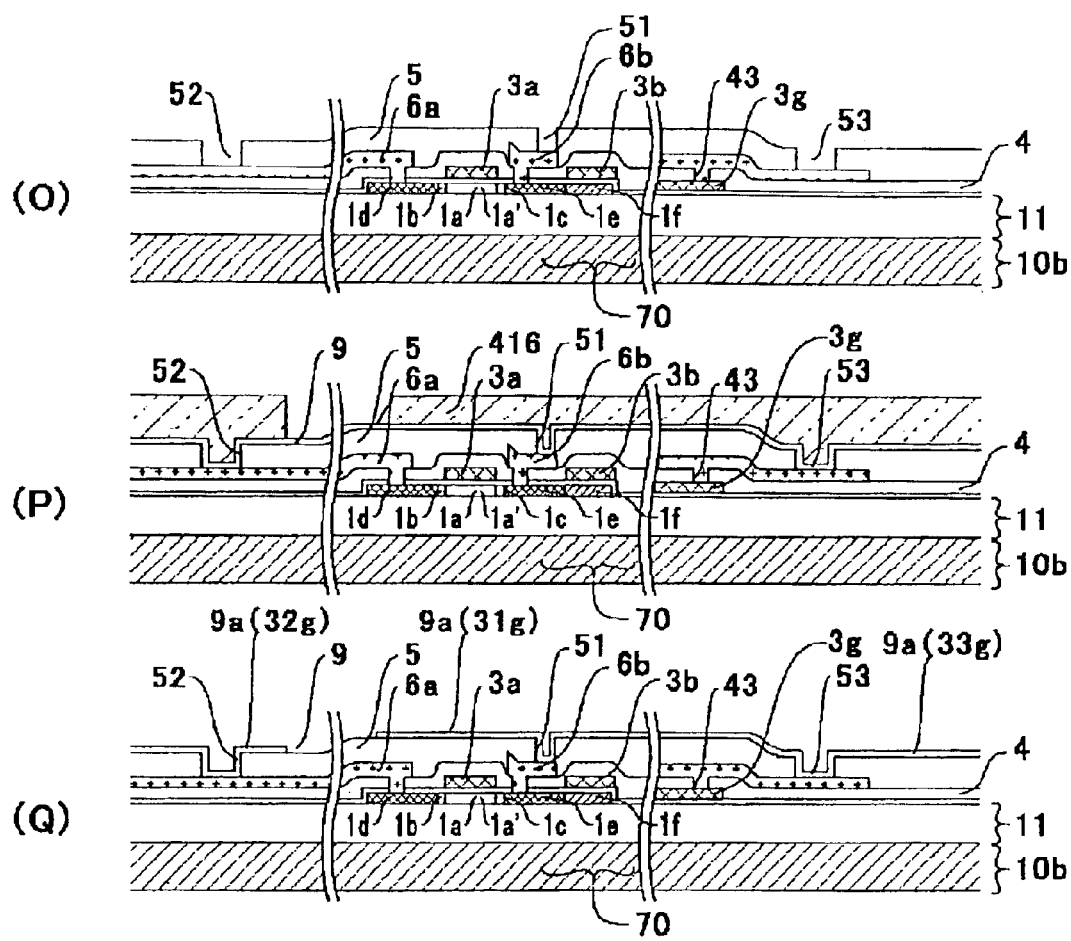
FIGS. 15(O) to 15(Q) are cross-sectional views showing a method for making the TFT array substrate of the present invention.

FIG. 8 is a plan view showing the structures of the inspection TFT and the inspection pads to inspect the pixel switching TFTs formed in the pixel region shown in FIG. 2. FIG. 9 is a cross-sectional view taken along planes A1-A1', A2-A2', and A3-A3' in FIG. 8. FIG. 10 is a plan view showing the structures of the inspection TFT and the inspection pad to inspect the driving-circuit TFTs used in the driving circuit shown in FIG. 6. FIG. 11 is a cross-sectional view taken along plane B1-B1' of FIG. 10.

First, as shown in FIGS. 8 and 9, in the dummy pixel region 10d (described with reference to FIG. 2) of the pixel region 10a, i.e., the first electrical-element-forming region, one of the dummy pixels 100d functions as a first inspection pixel 100x. The first inspection pixel 100x is provided with an inspection TFT 30g having the same structure and the size as the effective pixels 100c.

The inspection TFT 30g of the first inspection pixel 100x is formed simultaneously with the pixel-switching TFTs 30 formed in the effective pixel region 10c. The structure and the size of the inspection TFT 30g are the same as the pixel-switching TFTs 30 formed in the effective pixel region 10c. Accordingly, the explanation of the components of the inspection TFT 30g is omitted. The pixel electrode 9a of the inspection TFT 30g is used as a first inspection pad 31g electrically connected to the drain region 1e of the inspection TFT 30g. The first inspection pad 31g is electrically connected to the drain electrode 6b via the contact hole 51 in the interlayer insulating film 5. The drain electrode 6b is electrically connected to the drain region 1e of the inspection TFT 30g via the contact hole 42 in the interlayer insulating film 4.

Among the dummy pixels 100d, in a second inspection pixel 100y adjacent to the first inspection pixel 100x, the portion 6g is electrically connected to a second inspection pad 32g via a contact hole 52 in the interlayer insulating film 5. The portion 6g extends from the data line 6a toward the second inspection pixel 100y, and the second inspection pad 32g is constituted from the pixel electrode 9a.

Among the dummy pixels 100d, in a third inspection pixel 100z adjacent to the first inspection pixel 100x, a portion 3g is electrically connected to a junction electrode 6h via a contact hole 43 in the interlayer insulating film 4. The portion 3g extends from the scan line 3a (gate electrode) toward the third inspection pixel 100z, and the junction electrode 6h is disposed in the same layer as the data line 6a. A third inspection pad 33g is electrically connected to the junction electrode 6h via a contact hole 53 in the interlayer insulating film 5. The third inspection pad 33g is constituted from the pixel electrode 9a.

As shown in FIGS. 10 and 11, in the driving-circuit region, i.e., the second electrical-element-forming region, a complimentary TFT including an inspection P-channel TFT 180g and an inspection N-channel TFT 190g is formed in the region where no TFTs 180 or 190 for the driving circuit are formed. The inspection TFTs 180g and 190g are formed simultaneously with the TFTs 180 and 190 for driving circuit, and have the same structure and the same size as those of the TFTs 180 and 190 for driving circuit. Thus, the descriptions of the individual components of the inspection TFTs 180g and 190g are omitted. A high-potential line 171 is electrically connected to a fourth inspection pad 34g via a contact hole 54 in the interlayer insulating film 5. The fourth inspection pad 34g is of the ITO film constituting the pixel electrode 9a. An output interconnection 167, a low-potential line 172, and the input interconnection 166 are, respectively, electrically connected to a fifth inspection pad 35g, a sixth inspection pad 36g and a seventh inspection pad 37g via contact holes 55, 56, and 57.

In making the liquid crystal device 100 of this embodiment, inspection terminals are placed into contact with the inspection pads 31g to 37g after the TFTs 30, 180, and 190 and the like are formed at the TFT array substrate 10 so as to examine the electrical characteristics of the inspection TFTs 30g, 180g, and 190g. Only non-defective TFT array substrates 10 are used in assembling the liquid crystal devices 100 so as to enhance the yield of the liquid crystal device 100.

The inspection TFTs 30g and the inspection pads 31g to 33g to examine the pixel-switching TETs 30 are formed in the same pixel region 10a. Thus, the inspection TETs 30g, i.e., the objects that are actually examined, are near the pixel-switching TFTs 30, i.e., the objects of inspection. When the pixel-switching TFTs 30 are formed by a semiconductor process, the characteristics of the TFTs vary depending on the position in the substrate. According to this embodiment, the electrical characteristics of the pixel-switching TFTs 30 to be examined correspond with those of the inspection TFTs 30g. i.e., the TFTs used in actual measuring, with high accuracy. Moreover, the inspection TFTs used in actual measuring are also formed in the pixel region 10a, and therefore, since the region where the inspection TFTs 30g, the TFTs used in actual measuring, are formed is near the region where the TFTs 30 are formed, the conditions such as pattern density are the same. Accordingly, for example, the effect of the pattern density on exposure is the same between the region where the pixel-switching TIFTs to be examined 30 are formed and the region where the inspection TFTs 30g, i.e., the TFTs used in actual measuring, are formed. As a result, the electrical characteristics of the pixel-switching TFTs 30 to be examined reliably correspond with the electrical characteristics of the inspection TFTs 30g that have actually examined. Therefore, according to this embodiment, the electrical characteristics of the pixel-switching TFTs 30 can be accurately examined.

Although the inspection TFTs 30g and inspection pads 31g to 33g are formed in the pixel region 10a, they are formed in the dummy pixel region 10d that does not directly contribute to the display. Thus, a problem of a decrease in the effective pixel region 10c, i.e., the region where images are actually displayed, does not occur.

Moreover, the inspection TFTs 180g and 190g, and the inspection pads 34g to 37g to test the driving-circuit TFTs 180 and 190 are formed inside the driving-circuit region where the driving-circuit TFTs 180 and 190 are formed. Thus, the inspection TFTs 180g and 190g that actually examine are near the driving-circuit TFTs 180 and 190, which are the objects of the inspection. Thus, the electrical characteristics of the driving-circuit TFTs 180 and 190 can be reliably examined.

When part of the pixel region 10a has a structure different from the other pixels 100a, such as the second inspection pixel 100y and the third inspection pixel 100z, step differences may be generated inside the pixel region 10a. However, only a minute portion of the dummy pixels 100d is used as the inspection pixels. Thus, the cell gap remains the same even when the second inspection pixel 100y and the third inspection pixel 100z are formed in the pixel region 10a.

(Method for Making the TFT Array Substrate 10)

FIGS. 12(A) to 15(Q) are cross-sectional views showing steps for making the TFT array substrate 10 of this embodiment and correspond to the cross-section of the portion shown in FIG. 9. Since the TFTs 30, 30g, 180, 190, 180g, and 190g, and the inspection pads 31g to 37g are formed by the same process according to the corresponding layers, the steps for making the inspection TFTs 30g and the inspection pads 31g to 33g are mainly described in the following sections.

As shown in FIG. 12(A), after the transparent substrate 10b formed of glass or the like cleaned by ultrasonic washing or the like is prepared, the underlayer protecting film 11 made of a silicon oxide film having a thickness of 300 nm to 500 nm is formed on the entire surface of the transparent substrate 10b by a plasma-enhanced CVD method at a substrate temperature of 150° C. to 450° C. A mixture of monosilane and nitrous oxide gas, a mixture of tetraethoxysilane (TEOS) and oxygen, or a mixture of disilane and ammonia may be used as the source gas.

Next, as shown in FIG. 12(B), a semiconductor film 1, which is an amorphous silicon film, having a thickness of 30 nm to 100 nm is formed on the surface of the underlayer protecting film 11 by a plasma-enhanced CVD method at a substrate temperature of 150° C. to 450° C. Subsequently, the semiconductor film 1 is annealed by the radiation of laser beam so as to melt the amorphous semiconductor film and is then cooled and solidified to form crystals. Since the time of the laser irradiation of each region is extremely short, and the irradiated region is local relative to the entire substrate, the substrate as a whole is not heated to a high temperature. Thus, deformation or cracks do not occur even when a glass substrate is used as the transparent substrate 10b. Disilane or monosilane can be used as the source gas to form the semiconductor film 1.

Next, as shown in FIG. 12(C), a resist mask 402 is formed on the surface of the semiconductor film 1 by a photolithographic technique. The semiconductor film 1 is etched via the resist mask 402 so as to form the island-shaped semiconductor films 1a to form the pixel-switching TFTs 30 and the TFTs 30g for inspection, as shown in FIG. 12(D). The island-shaped semiconductor films 160 to form the TFTs 180, 190, 180g, and 190g for driving circuit and for inspection are also formed, but this is not shown in FIG. 12(D).

Next, as shown in FIG. 12(E), the gate insulating film 2, which is a silicon oxide film having a thickness of 50 nm to 150 nm, is formed on the entire surface of the transparent substrate 10b at a temperature of 350° C. or less. A mixture of TEOS and oxygen gas may be used as the source gas. The gate insulating film 2 may be silicon nitride film instead of silicon oxide film.

Next, impurity ions are implanted in the extended portion 1f of the semiconductor film 1a through a predetermined resist mask so as to form a lower electrode to form the storage capacitor 70 between the lower electrode and the capacitor line 3b, although this step is not shown in FIG. 12(E).

Next, as shown in FIG. 13(F), a conductive film 3, which is a conductive film mainly formed of aluminum, tantalum, molybdenum, or an alloy thereof, may be formed on the entire surface of the transparent substrate 10b to a thickness of 300 nm to 800 nm by a sputtering method or the like. Subsequently, a resist mask 403 is formed by a photolithographic technique, and the conductive film 3 is dry-etched through the resist mask 403. As a result, as shown in FIG. 13(G), the scan line 3a, the extended portion 3g, and the capacitor line 3b are formed.

Next, as shown in FIG. 13(H), the semiconductor film 160 (not shown) to make the P-channel TFTs 180 and 180g is covered with a resist mask. Low-density N-type impurity ions (phosphorus ions) are implanted at a doze of approximately $0.1 \times 10^{13}/cm^2$ to approximately to $10 \times 10^{13}/cm^2$ in the semiconductor film 1a for forming the TFTs 30 and 30g for pixel switching and inspection and in the semiconductor film 160 for forming the N-channel TFT 190 and 190g for driving circuit and inspection, using the scan line 3a and the gate electrode 165 as masks. As a result, the lightly doped source regions 1b and 193, and the lightly doped drain regions 1c and 195 are formed in a self-aligning manner relative to the scan line 3a and the gate electrode 165. No impurity ions are introduced to the portions directly below the scan line 3a and the gate electrode 165. These portions remain as the semiconductive films 1a and 160 and function as the channel regions 1a' and 191.

Next, as shown in FIG. 13(I), a resist mask 412, wider than the scan line 3a and the gate electrode 165, is formed to cover the semiconductor film 160 to form the P-channel TFTs 180 and 180g. High-density N-type impurity ions (phosphorus ions) are implanted at a doze of approximately $0.1 \times 10^{15}/cm^2$ to approximately to $10 \times 10^{15}/cm^2$ so as to form the heavily doped source regions 1d and 192 and the heavily doped drain regions 1e and 194.

Next, as shown in FIG. 14(J), the semiconductor films 1a and 160 to form the N-channel TFTs 30, 30g, 190, and 190g are covered with a resist mask 413. Low-density P-type impurity ions (boron ions) are implanted at a doze of approximately $0.1 \times 10^{13}/cm^2$ to approximately to $10 \times 10^{13}/cm^2$ in the semiconductor film 160 for forming the P-channel TFTs 180 and 180g using the gate electrode 165 as a mask. As a result, as shown in FIGS. 7 and 10, the lightly doped source region 183 and the lightly doped drain regions 185 are formed in a self-aligning manner with respect to the gate electrode 165. No impurity ions are introduced to the portions directly below the gate electrode 165. These portions remain as the semiconductive film 160 and functions as the channel region 181.

Next, as shown in FIG. 14(K) a resist mask 414, wider than the gate electrode 165, is formed to cover the semiconductor films 1a and 160 to form the N-channel TFTs 30, 30g, 190, and 190g. High-density P-type impurity ions (boron ions) are implanted at a doze of approximately $0.1 \times 10^{15}/cm^2$ to approximately to $10 \times 10^{15}/cm^2$ in the semiconductor film 160 to form the P-channel TFTs 180 and 180g. As a result, as shown in FIGS. 7 and 10, the heavily doped source region 182 and the heavily doped drain region 184 are formed.

Instead of these impurity-introduction steps, a resist mask, wider than the gate electrode, may be formed without implantation of low-density impurities, and then high-density impurities may be implanted so as to form source and drain regions of the offset structure. Alternatively, high-density impurities may be implanted using the scan line 3a and the gate electrode as masks so as to make source and drain regions of a self-alignment structure. Alternatively, a P-channel TFT including the source and drain regions of the self-alignment structure and an N-channel TFT including the lightly doped source and drain regions and heavily doped source and drains regions may be formed.

Next, as shown in FIG. 14(L), the interlayer insulating film 4 formed of silicon oxide or the like is formed on the entire surface of the transparent substrate 10b. A resist mask is formed on the surface of the interlayer insulating film 4 by a photolithographic technique, and the interlayer insulating film 4 is etched through the openings of the resist mask so as to form the contact holes 41, 42, and 43. Subsequently, the resist mask is removed.

Next, as shown in FIG. 14(M), a conductive film 6, such as an aluminum film, a tantalum film, or molybdenum film, is formed by a sputtering method to a thickness of 300 nm to 800 nm. A resist mask 405 is formed by a photolithographic technique, and the conductive film 6 is dry-etched through the resist mask 405 so as to make the data line 6a, the extended portion 6g, the drain electrode 6b, and the junction electrode 6h at the surface of the interlayer insulating film 4, as shown in FIG. 14(N).

Next, as shown in FIG. 15(O), the interlayer insulating film 5 formed of silicon nitride or the like is formed on the entire surface of the transparent substrate 10b. A resist mask is formed on the surface of the interlayer insulating film 5 by a photolithographic technique, and the interlayer insulating film 5 is etched through the openings of the resist mask so as to form the contact holes 51, 52, and 53, and so on. Subsequently, the resist mask is removed.

Next, as shown in FIG. 15(P), an ITO film 9 having a thickness of 40 nm to 200 nm is formed on the surface of the interlayer insulating film 5 by a sputtering method or the like. A resist mask 416 is formed by a photolithographic technique, and the ITO film 9 is etched through the resist mask 416 so as to form pixel electrodes 9a (the inspection pads 31g, 32g, and 33g), as shown in FIG. 15(Q).

Next, the electrical characteristics of the inspection TFTs 30g are examined through the inspection pads 31g to 33g. The electrical characteristics of the inspection TFTs 180g and 190g are also examined through the inspection pads 34g, 35g, 36g, and 37g shown in FIG. 11. The quality of the TFT array substrates 10 are examined, and only the TFT array substrates 10 that have satisfactory quality are subjected to back end processes.

In actual processes, TFTs of many TFT array substrates 10 are formed in a large substrate and are inspected as they are formed on the large substrate. Subsequently, the TFT array substrates 10 are cut out from the large substrate. Accordingly, it is necessary to confirm the positions of the defective TFT array substrates 10 and the positions of the satisfactory TFT array substrates 10, and then the polyimide films (alignment films 12) are formed at the surfaces of the transparent electrodes 9a, as shown in FIGS. 5 and 9. The polyimide films are formed by applying by a flexography a polyimide varnish prepared by dissolving 5 to 10 weight percent of polyimide or polyamide acid into a solvent such as butyl cellosolve or n-methylpyrrolidone, and then heating the applied varnish so as to allow the varnish to harden (sintering). The resulting substrate provided with the polyimide film is rubbed in a predetermined direction with a puff cloth made of rayon fiber so as to align the polyimide molecules around the surface in a predetermined direction. As a result, when the liquid crystal is supplied, the liquid crystal molecules align in a predetermined direction due to the interaction with the polyimide molecules.

The TFT array substrate 10 prepared as above is then bonded to the counter substrate 20 by the sealant 107.

[Other Embodiment]

Figure 16:
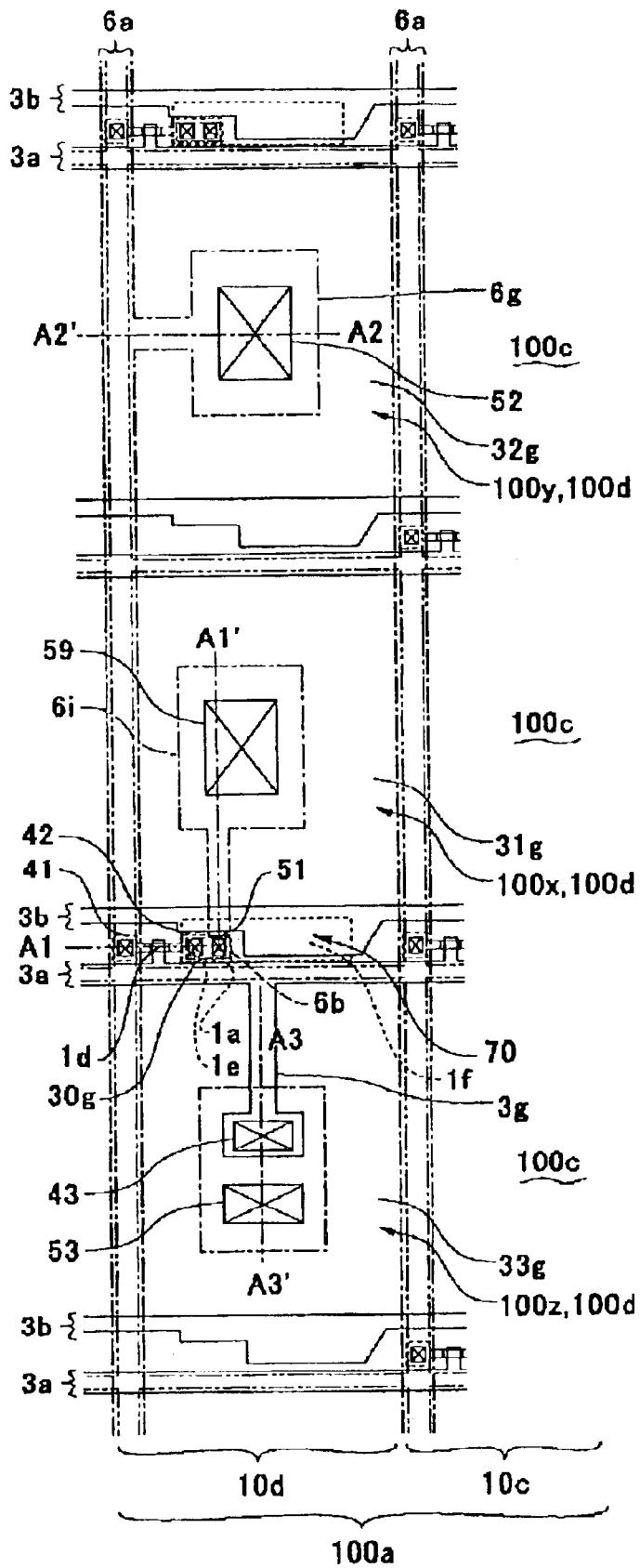
FIG. 16 is a plan view showing the structures of the inspection TFTs and the inspection pads to examine the pixel switching TFTs in another liquid crystal device incorporating the present invention.
Figure 17:
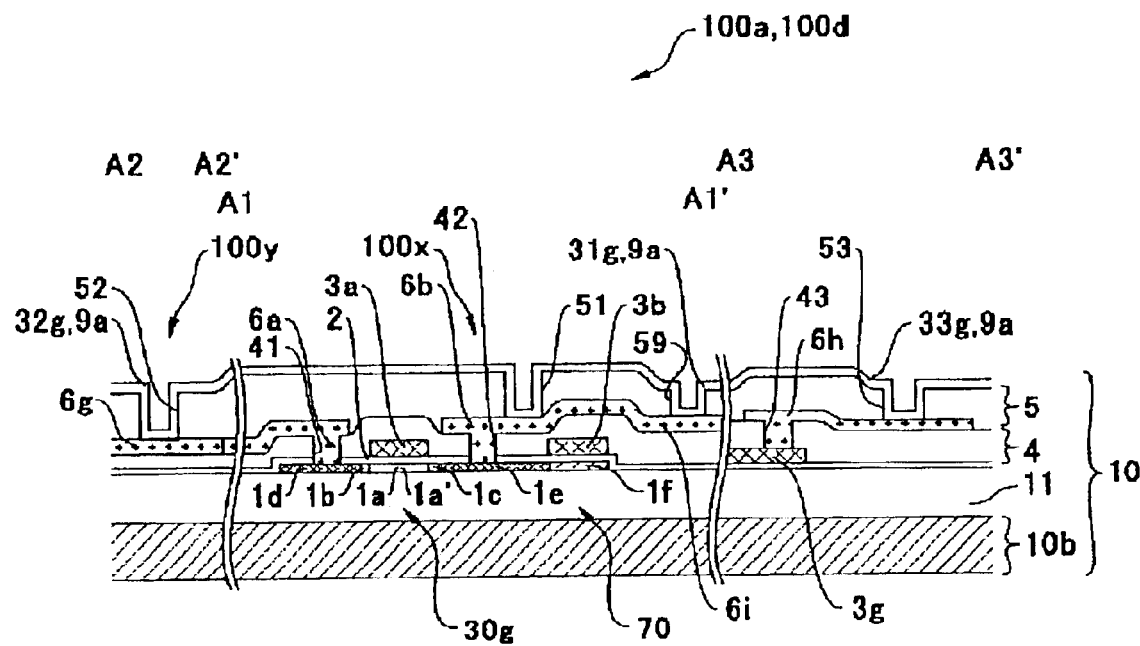
FIG. 17 is a cross-sectional view taken at positions corresponding to planes A1-A1', A2-A2', and A3-A3' in FIG. 16.

In the first inspection pixel 100x of the above-described embodiment, the drain electrode 6b is electrically connected to the pixel electrode 9a (the first inspection pad 31g) via the contact hole 51 as with the effective pixels 100c. However, as shown in FIGS. 16 and 17, the drain electrode 6b may extend further in the first inspection pixel 100x so that an extended portion 6i electrically connects with the pixel electrode 9a (the first inspection pad 31g) via a contact hole 59 in the interlayer insulating film 5. According to this structure, while the electrical characteristics of the inspection TFTs 30g can be examined through the inspection pads 3 1g, 32g, and 33g constituted from the pixel electrode 9a, the electrical characteristics of the inspection TFTs 30g can be examined before forming the pixel electrode 9a by using the extended portion 6i of the drain electrode 6b, the extended portion 6g from the data line 6a, and the junction electrode 6h as the inspection pads.

Although the above-described embodiments are explained in terms of a liquid crystal device using the TFTs as the active elements for pixel switching, the present invention can be applied to liquid crystal devices employing TFDs as the pixel switching elements.

Moreover, the present invention can be applied to electrooptic apparatuses using electrooptic materials other than liquid crystal, such as organic electroluminescent apparatuses.

[Application of the Liquid Crystal Device to an Electronic Apparatus]

The liquid crystal device 100 having the above-described structure can be used as a display unit of various electronic apparatuses. An example of such an electronic apparatus is explained with reference to FIG. 18 and FIGS. 19(A) and 19(B).

Figure 18:
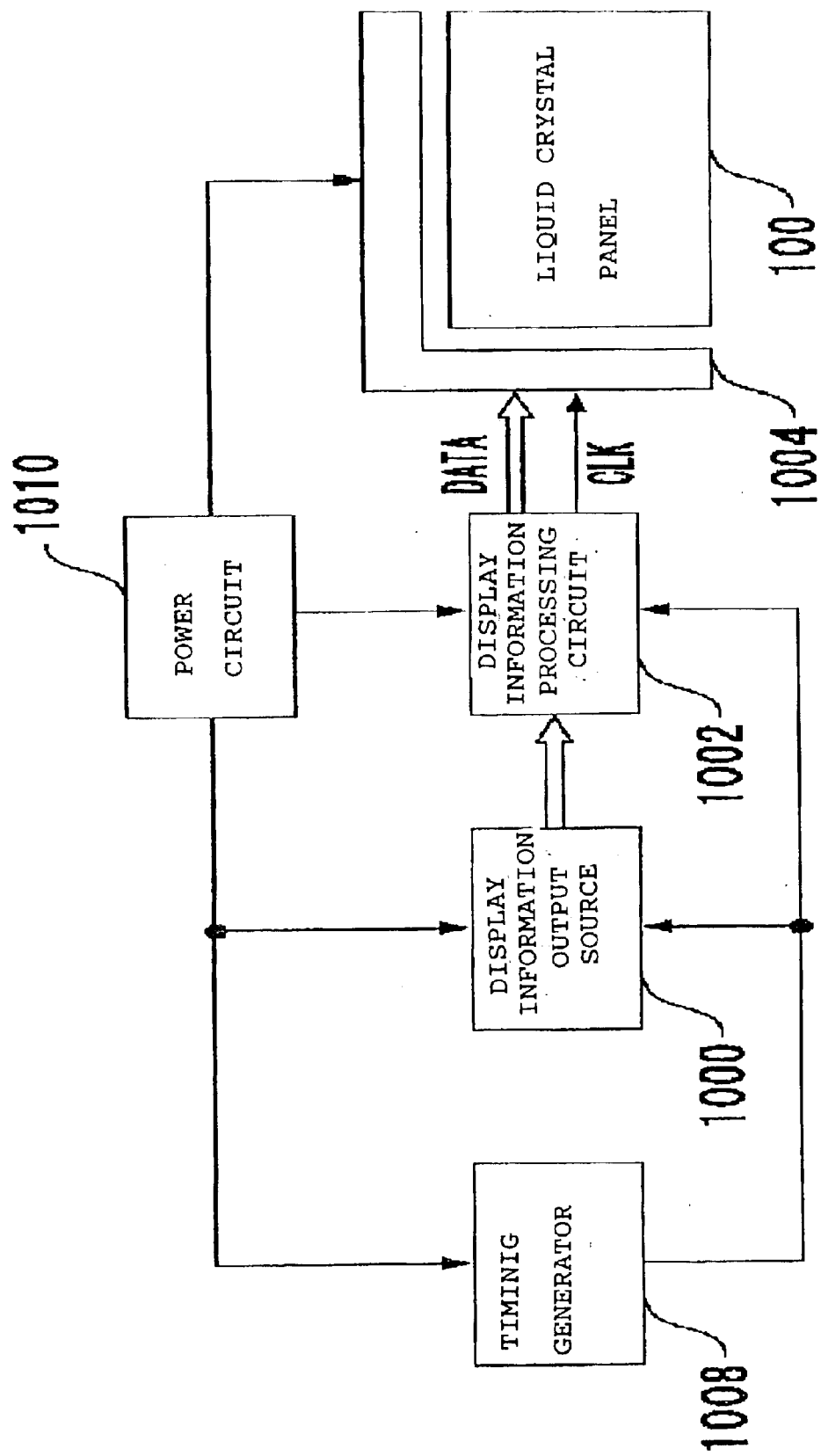
FIG. 18 is a schematic showing the configuration of a circuit of an electronic apparatus incorporating the liquid crystal device of the present invention as a display unit.

FIG. 18 is a schematic showing the configuration of a circuit of an electronic apparatus incorporating the liquid crystal device of the present invention as a display unit.

In FIG. 18, the electronic apparatus includes a display information output source 1000, a display information processing circuit 1002, a power circuit 1010, a timing generator 1008, and a liquid crystal device. The liquid crystal device includes a liquid crystal display panel 100 and a driving circuit 1004. The liquid crystal device 100 described above can be used as the liquid crystal device.

The display information output source 1000 has memories, such as a read-only-memory (ROM), a random access memory (RAM), and the like, a storage unit, such as various types of disks, and a synchronizing circuit for synchronously outputting digital image signals. The display information output source 1000 supplies the display information processing circuit 1002 with display information such as image signals in a predetermined format based on various types of clock signals generated by the timing generator 1008.

The display information processing circuit 1002 includes various circuits, such as related art circuits including, for example, serial/parallel conversion circuit, an amplifier/ inverter circuit, a rotation circuit, a gamma correction circuit, a clamp circuit, and the like. The display information processing circuit 1002 processes the input display information and supplies the image signals and the clock signal CLK to the driving circuit 1004. The power circuit 1010 supplies predetermined voltages to the components.

Figure 19:
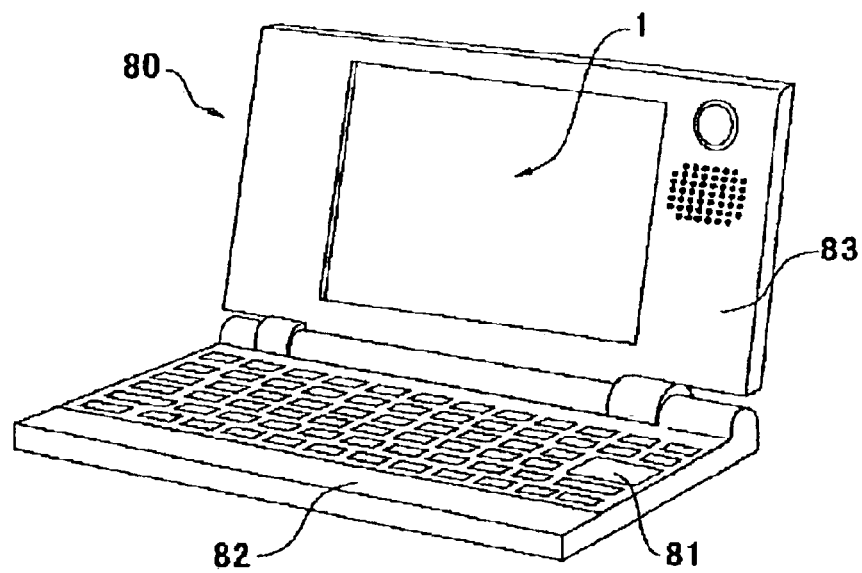
FIGS. 19(A) and 19(B) are, respectively, a perspective view showing a mobile personal computer, and a perspective view showing a cellular phone employing the liquid crystal device of the present invention.
Figure 19:
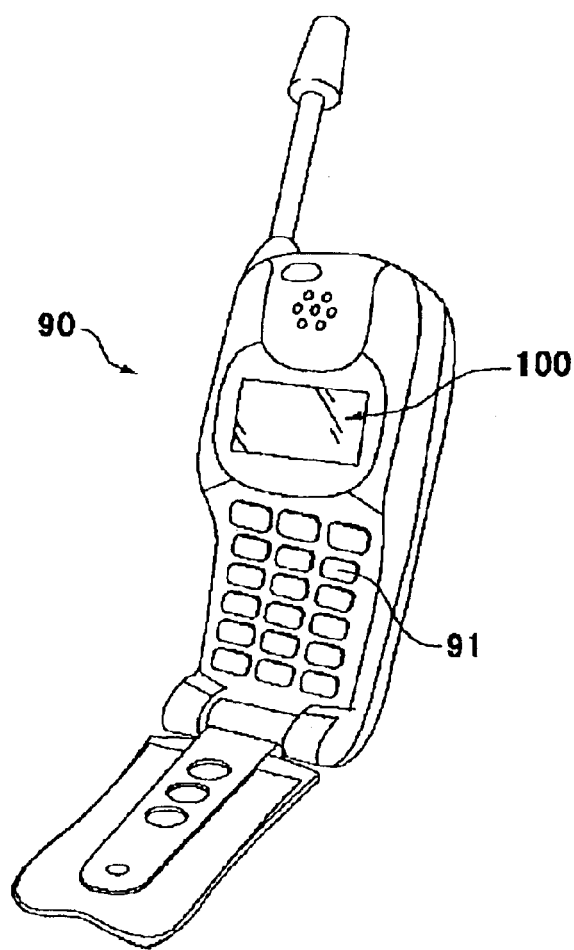
Figure 20:
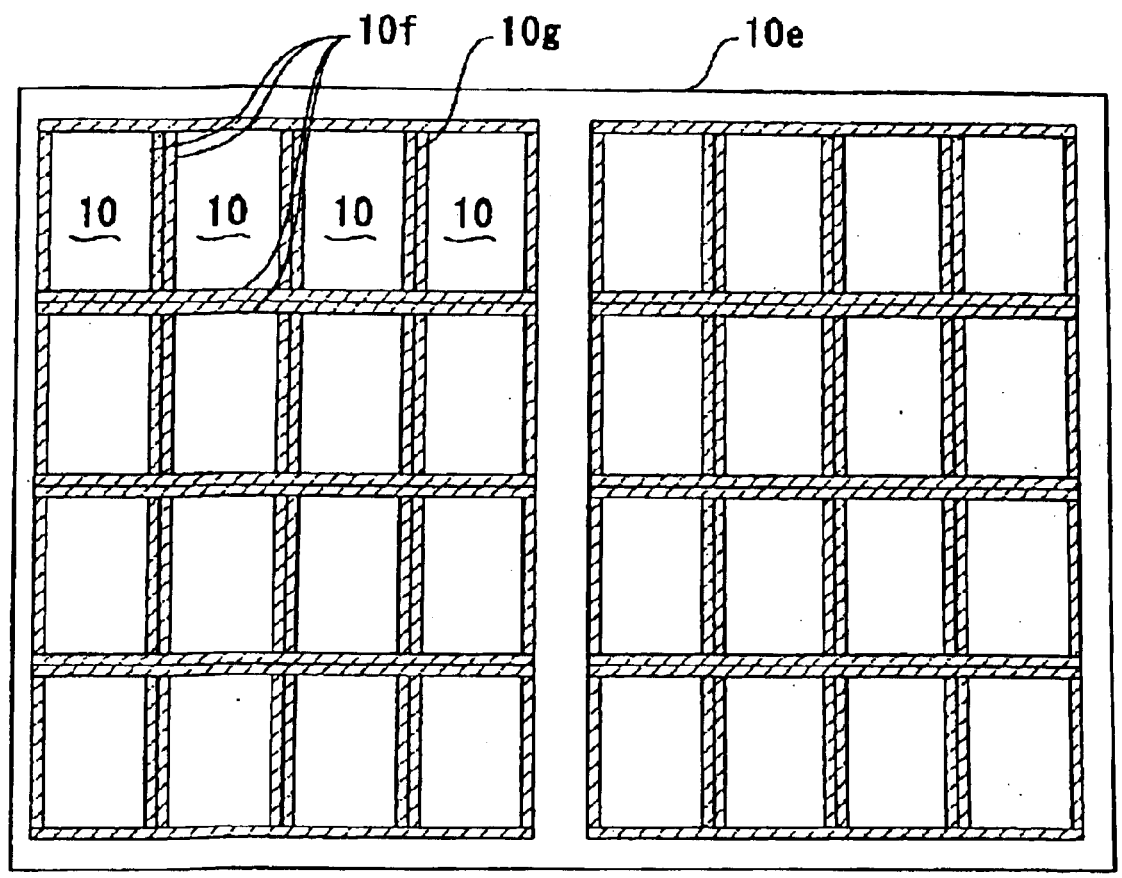
FIG. 20 is a schematic showing the process of making TFT array substrate used in a related art liquid crystal devices from a large substrate.
Figure 21:
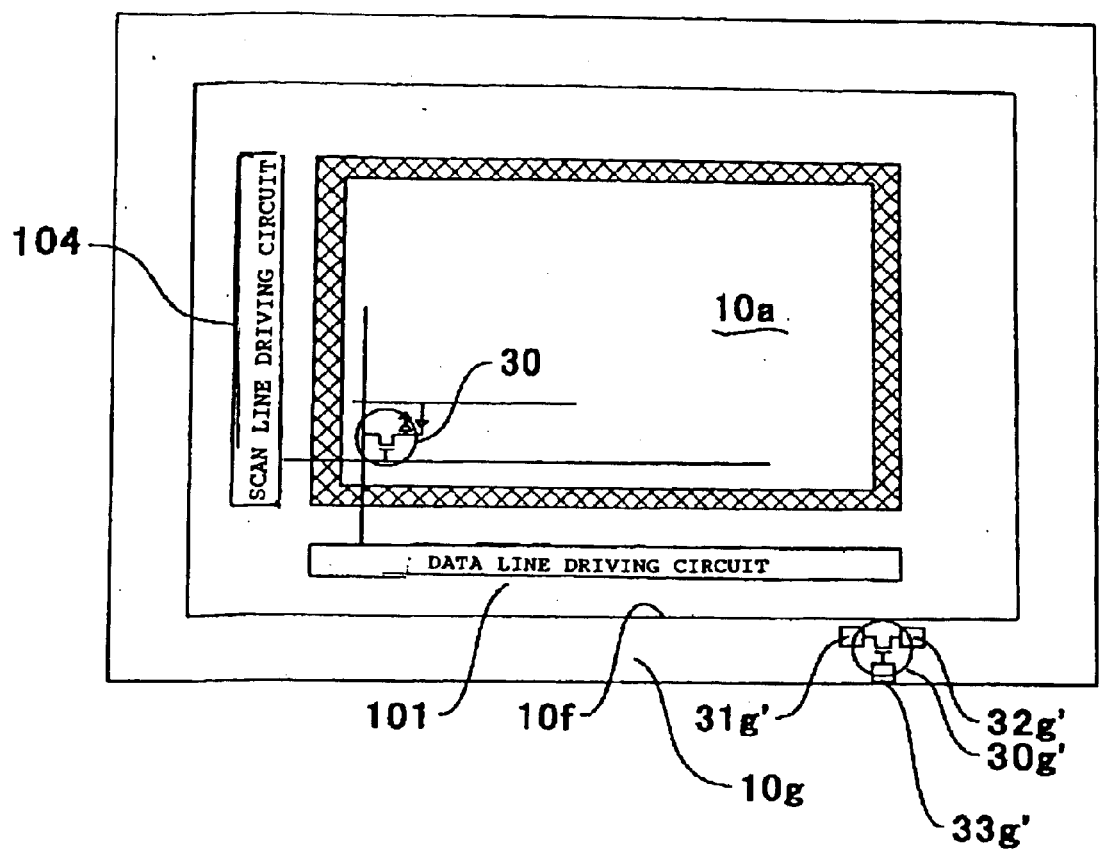
FIG. 21 is a schematic showing the structures of inspection TFTs and inspection pads to examine pixel-switching TFTs in related art liquid crystal devices.

FIG. 19(A) shows a mobile personal computer which is an exemplary embodiment of an electronic apparatus of the present invention. A personal computer 80 includes a main unit 82 having a keyboard 81 and a liquid crystal display unit 83. The liquid crystal display unit 83 includes the liquid crystal device 100 described above.

FIG. 19(B) shows a cellular phone, which is another exemplary embodiment of an electronic apparatus according to the present invention. A cellular phone 90 includes a plurality of operating keys 91 and a display unit that includes the above-described liquid crystal device 100.

[Advantages]

As described above, according to the present invention, the inspection pattern to examine the thin-film switching element formed inside the electrical-element-forming region is formed inside the electrical-element-forming region. Thus, the thin-film switching elements to be examined are close to the inspection pattern used in actual measuring. Thus, when thin-film switching elements, such as TFTs, are formed on a substrate by a semiconductor process, gross errors in the correspondence between the electric characteristics of the thin-film switching element to be examined and those of the inspection pattern used in actual measuring resulting from the difference in positions in the substrate or in pattern density, or the like can be avoided. Thus, the electrical characteristics of the thin film switching elements formed in the substrate for supporting the electrooptical material can be examined with high accuracy.

What is claimed is:

1. An electrooptic device, comprising:

an electrooptic material;

a substrate to support the electrooptic material; and an electrical-element-forming region including thin-film switching elements formed on the substrate, an inspection pattern to examine the characteristics of the thin-film switching elements and inspection pads electrically connected to the inspection pattern being formed inside the electrical-element-forming region.

2. The electrooptic device according to claim 1, the electrical-element-forming region being a pixel region in which pixels having pixel electrodes to drive the electrooptic material and pixel-switching active elements formed as the thin-film switching elements to drive the pixel electrodes are arranged in a matrix, an effective pixel region and a dummy pixel region arranged at the external periphery of the effective pixel region being formed in the pixel region, the effective pixel region including a plurality of effective pixels, arranged in a matrix to display images, the dummy pixel region including a plurality of dummy pixels covered with a light-shielding member so as not to directly contribute to display of images, the inspection pattern and the inspection pads being formed inside the dummy pixel region.

3. The electrooptic device according to claim 2, a pixel-switching thin-film transistor, which functions as the pixel-switching active element, being formed in each of the effective pixels and the dummy pixels, the pixel-switching thin-film transistor including a source region electrically connected to a data line, a drain region electrically connected to the pixel electrode, and a channel region opposing a gate electrode with an insulating film therebetween, the inspection pattern being formed in at least one of the plurality of dummy pixels, the inspection pattern including an inspection thin-film transistor having the same size and the same structure as the pixel-switching thin-film transistor, in the dummy pixel region, a first inspection pixel in which the inspection thin-film transistor is formed being provided with a first inspection pad electrically connected to the drain region of the inspection thin-film transistor, a second inspection pixel adjacent to the first inspection pixel being provided with a second inspection pad electrically connected to the source region of the inspection thin-film transistor, and a third inspection pixel adjacent to the first inspection pixel being provided with a third inspection pad electrically connected to the gate electrode of the inspection thin-film transistor.

4. The electrooptic device according to claim 3, the first inspection pad being electrically connected, via a contact hole in an interlayer insulating film, to a drain electrode connected to the drain region of the inspection thin-film transistor, the second inspection pad being electrically connected to an extended portion of the data line via a contact hole in the interlayer insulation film, the extended portion extending to the second inspection pixel, the third inspection pad being electrically connected to an extended portion of the gate electrode via a contact hole in the interlayer insulation film, the extended portion extending to the third inspection pixel.

5. The electrooptic device according to claim 1, a pixel region in which pixels including pixel electrodes to drive the electrooptic material and pixel-switching thin-film transistors to drive the pixel electrodes are arranged in a matrix being formed in the substrate, an electrical-element forming region being formed outside the pixel region, the electrical-element forming region including a driving circuit including many driving-circuit thin-film transistors as the thin-film switching elements to supply signals to the pixel switching thin-film transistors, the inspection pattern and the inspection pads being formed inside a driving-circuit forming region where the driving circuit is formed, and the inspection pattern being formed in a free region where no driving-circuit thin-film transistors are formed, the free region being inside the driving-circuit forming region.

6. The electrooptic device according to claim 5, the inspection pattern including an inspection thin-film transistor having the same structure and the same size as the driving-circuit thin-film transistors.

7. The electrooptic device according to claim 1, the electrooptic material being liquid crystal disposed between the substrate and a counter substrate that opposes the substrate with a predetermined gap therebetween.

8. An electronic apparatus, comprising:

the electrooptic device according to claim 1.

* * * * *